(12) United States Patent
Lee et al.

(10) Patent No.: US 12,356,839 B2
(45) Date of Patent: Jul. 8, 2025

(54) DISPLAY DEVICE HAVING TWO ORGANIC REFRACTIVE LAYERS ON A PROTRUDING INORGANIC LAYER AND METHOD FOR MANUFACTURING SAME

(71) Applicant: Samsung Display Co., Ltd., Yongin-si (KR)

(72) Inventors: Ki June Lee, Yongin-si (KR); Sang Woo Kim, Seoul (KR); Jung Ha Son, Yongin-si (KR); Byung Han Yoo, Suwon-si (KR); Gee Bum Kim, Seoul (KR); Tae Kyung Ahn, Pyeongtaek-si (KR); Jae Ik Lim, Hwaseong-si (KR); Chaun Gi Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 719 days.

(21) Appl. No.: 17/416,359

(22) PCT Filed: Oct. 25, 2019

(86) PCT No.: PCT/KR2019/095039
§ 371 (c)(1),
(2) Date: Jun. 18, 2021

(87) PCT Pub. No.: WO2020/130760
PCT Pub. Date: Jun. 25, 2020

(65) Prior Publication Data
US 2022/0077427 A1      Mar. 10, 2022

(30) Foreign Application Priority Data
Dec. 21, 2018   (KR) .................. 10-2018-0167747

(51) Int. Cl.
*H10K 59/80*   (2023.01)
*H10K 59/12*   (2023.01)
(Continued)

(52) U.S. Cl.
CPC .......... *H10K 59/879* (2023.02); *H10K 59/122* (2023.02); *H10K 59/40* (2023.02); *H10K 59/873* (2023.02); *H10K 59/1201* (2023.02)

(58) Field of Classification Search
CPC .. H10K 50/858; H10K 50/844; H10K 59/879; H10K 59/873; H10K 59/40; H10K 59/126
See application file for complete search history.

(56) References Cited

U.S. PATENT DOCUMENTS 8,921,840 B2   12/2014   Kim et al.
10,541,385 B2   1/2020   Sakamoto
(Continued)

FOREIGN PATENT DOCUMENTS

JP   2006-278115 A   10/2006
JP   2009-110873 A   5/2009
(Continued)

OTHER PUBLICATIONS

International Search Report for corresponding Application No. PCT/KR2019/095039 dated Feb. 6, 2020, 4pp.
(Continued)

*Primary Examiner* — Kevin Parendo
(74) *Attorney, Agent, or Firm* — Womble Bond Dickinson (US) LLP

(57) ABSTRACT

A display device includes: a substrate; a bank layer on the substrate, and defining a light-emitting area; an organic light-emitting layer in the light-emitting area; a thin-film sealing layer covering the organic light-emitting layer and the bank layer; an inorganic layer including a base part on the thin-film sealing layer, and a protruding pattern part protruding from the base part in a thickness direction and including a lateral surface having a reverse taper angle; a first low refractive organic layer on the base part of the
(Continued)

inorganic layer; and a high refractive organic layer covering the first low refractive organic layer and the inorganic layer. A lateral surface of the first low refractive organic layer contacts the lateral surface of the protruding pattern part, and an upper surface of the first low refractive organic layer protrudes more than an upper surface of the protruding pattern part in the thickness direction.

20 Claims, 28 Drawing Sheets

(51) Int. Cl.
    *H10K 59/122*     (2023.01)
    *H10K 59/40*     (2023.01)

(56) References Cited

U.S. PATENT DOCUMENTS

| | | | |
|---|---|---|---|
| 2011/0199564 A1* | 8/2011 | Moriwaki | H10K 59/122 313/523 |
| 2014/0124749 A1 | 5/2014 | Kim et al. | |
| 2015/0041779 A1* | 2/2015 | Park | H10K 50/858 362/326 |
| 2017/0279084 A1 | 9/2017 | Sakamoto et al. | |
| 2017/0308196 A1* | 10/2017 | Jeong | H10K 50/844 |
| 2018/0184075 A1 | 6/2018 | Park et al. | |
| 2018/0204892 A1 | 7/2018 | Sakamoto et al. | |
| 2018/0301665 A1 | 10/2018 | Sakamoto | |

FOREIGN PATENT DOCUMENTS

| | | |
|---|---|---|
| JP | 2018-181668 A | 11/2018 |
| KR | 2009-0018580 A | 2/2009 |
| KR | 10-2014-0014682 A | 2/2014 |
| KR | 10-20140059372 A | 5/2014 |
| KR | 2016-0034457 A | 3/2016 |
| KR | 10-2018-0047560 A | 5/2018 |
| KR | 10-1928646 B | 12/2018 |

OTHER PUBLICATIONS

Korean Notice of Allowance for KR Application No. 10-2018-0167747 dated Nov. 29, 2023, 3 pages.

* cited by examiner

DISPLAY DEVICE HAVING TWO ORGANIC REFRACTIVE LAYERS ON A PROTRUDING INORGANIC LAYER AND METHOD FOR MANUFACTURING SAME

CROSS-REFERENCE TO RELATED APPLICATIONS

This application is a U.S. National Phase Patent Application of International Patent Application Number PCT/KR2019/095039, filed on Oct. 25, 2019, which claims priority to Korean Patent Application Number 10-2018-0167747, filed on Dec. 21, 2018, the entire content of all of which is incorporated herein by reference.

BACKGROUND

1. Field

Aspects of embodiments of the present disclosure relate to a display device, and a method of manufacturing the same, and more particularly, aspects of embodiments of the present disclosure relate to an organic light-emitting display device, and a method of manufacturing the same.

2. Description of the Related Art

Electronic devices, such as smart phones, digital cameras, notebook computers, navigation systems, and smart televisions, which provide images to users, include display devices for displaying the images.

With the development of multimedia, display devices are becoming more important. Accordingly, various types of display devices, for example, such as liquid crystal display (LCD) devices, organic light-emitting diode (OLED) display devices, and the like, have been developed.

From among these display devices, the OLED display device includes an organic light-emitting element, which is a self-luminous element. The organic light-emitting element may include two opposing electrodes, and an organic light-emitting layer interposed therebetween. Electrons and holes provided from the two opposing electrodes are recombined in the light-emitting layer to generate excitons, and the generated excitons transition from an excited state to a ground state, and thus, light may be emitted.

SUMMARY

One or more embodiments of the present disclosure are directed to a display device in which a process stability of a total reflection layer disposed on a light-emitting element is secured.

One or more embodiments of the present disclosure are directed to a method of manufacturing the display device in which a process stability of a total reflection layer disposed on a light-emitting element is secured.

However, the present disclosure is not limited to the above aspects and features, and other aspects and features of the present disclosure will become apparent to those skilled in the art from the following description, the detailed description, and the figures.

According to one or more embodiments of the present disclosure, a display device includes: a substrate including a plurality of pixels; a bank layer on the substrate along a boundary of each of the pixels, and configured to define a light-emitting area; an organic light-emitting layer in the light-emitting area defined by the bank layer; a thin-film sealing layer covering the organic light-emitting layer and the bank layer; an inorganic layer including a base part on the thin-film sealing layer, and a protruding pattern part protruding from the base part in a thickness direction, the protruding pattern part including a lateral surface having a reverse taper angle; a first low refractive organic layer on the base part of the inorganic layer; and a high refractive organic layer covering the first low refractive organic layer and the inorganic layer. A lateral surface of the first low refractive organic layer contacts the lateral surface of the protruding pattern part, and an upper surface of the first low refractive organic layer protrudes in the thickness direction more than an upper surface of the protruding pattern part in the thickness direction.

In an embodiment, the display device may include a first area, and a second area, the bank layer being at the first area, and the light-emitting area being at the second area; the base part of the inorganic layer may be at the first area and the second area; the protruding pattern part of the inorganic layer may be at the second area; the first low refractive organic layer may be at the first area; and the high refractive organic layer may be at the first area and the second area.

In an embodiment, a refractive index of the first low refractive organic layer may be lower than a refractive index of the high refractive organic layer; and a refractive index of the inorganic layer may be higher than the refractive index of the high refractive organic layer.

In an embodiment, the protruding pattern part and the base part may include the same material as each other, and may be connected to each other without a physical boundary therebetween.

In an embodiment, the first low refractive organic layer may include at least one of silicon nitride, silicon oxynitride, silicon oxide, titanium oxide, or aluminum oxide.

In an embodiment, the protruding pattern part and the base part may include different materials from each other, and may be located at separate layers from each other.

In an embodiment, the first low refractive organic layer may include a lower low refractive organic layer that contacts the lateral surface of the protruding pattern part, and an upper low refractive organic layer that protrudes more than the upper surface of the protruding pattern part in the thickness direction.

In an embodiment, the lower low refractive organic layer may include a first tapered surface adjacent to a pixel from among the plurality of pixels; the upper low refractive organic layer may include a second tapered surface adjacent to the pixel; an inclination angle of the first tapered surface may have as a first taper angle; an inclination angle of the second tapered surface may have as a second taper angle; and each of the first taper angle and the second taper angle may be in a range of 60° to 85°.

In an embodiment, the second taper angle may be equal to the first taper angle.

In an embodiment, the second taper angle may be different from the first taper angle.

In an embodiment, the first tapered surface and the second tapered surface may be at different planes from each other.

In an embodiment, the first taper angle may be in a range of 70° to 75°.

In an embodiment, the lower low refractive organic layer may have a thickness that is less than that of the upper low refractive organic layer.

In an embodiment, the display device may further include a buffer film between the thin-film sealing layer and the inorganic layer, and the buffer film may include the same material as that of the inorganic layer.

In an embodiment, the display device may further include a touch sensor layer on the thin-film sealing layer, and the touch sensor layer may be at the first area.

In an embodiment, the touch sensor layer may not overlap with the first low refractive organic layer.

In an embodiment, the touch sensor layer may include a first metal layer on the buffer film, and a second metal layer on the inorganic layer.

In an embodiment, the display device may further include a second low refractive organic layer at the first area, and surrounding the first low refractive organic layer in a plan view.

In an embodiment, the inorganic layer may further include a second protruding pattern part between the first low refractive organic layer and the second low refractive organic layer.

According to one or more embodiments of the present disclosure, a method of manufacturing a display device including a light-emitting element, and a thin-film sealing layer on the light-emitting element, includes: forming a base inorganic layer on the thin-film sealing layer; etching the base inorganic layer, and forming an inorganic layer including a base part and a protruding pattern part; forming a base organic layer on the inorganic layer; etching the base organic layer, and forming a low refractive organic layer on the base part; and forming a high refractive organic layer covering the low refractive organic layer, and having a refractive index that is higher than that of the low refractive organic layer. The protruding pattern part includes a lateral surface protruding from the base part in a thickness direction, the later surface having a reverse taper angle, and the low refractive organic layer includes a lateral surface contacting the lateral surface of the protruding pattern part, and an upper surface protruding more than an upper surface of the protruding pattern part in the thickness direction.

According to one or more embodiments of the present disclosure, a display device in which a process stability is secured may be provided by including a protruding pattern part capable of supporting a lateral surface of a total reflection layer.

According to one or more embodiments of the present disclosure, a method of manufacturing a display device in which a process stability is secured may be provided by forming a protruding pattern part capable of supporting a lateral surface of a total reflection layer.

However, the aspects and features of the present disclosure are not limited to those described above, and various other aspects and features may be included in the present specification.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
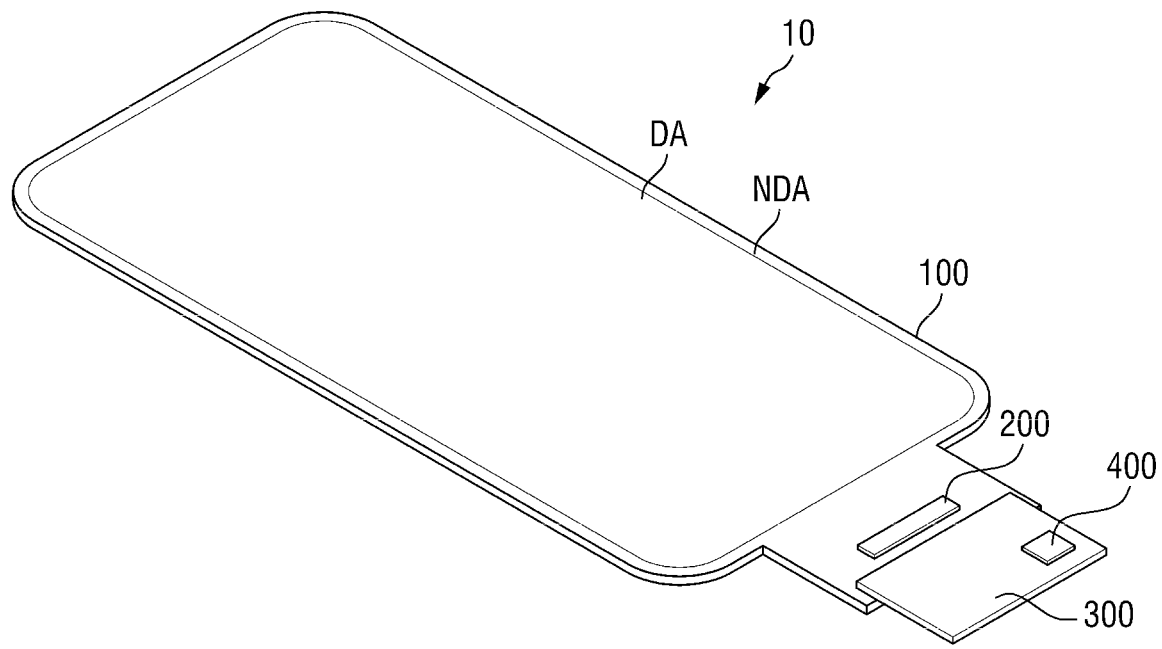
FIG. 1 is a perspective view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The embodiments described herein may be described with reference to a plan view and a cross-sectional view that are idealized schematic views of the embodiments of the present disclosure. Accordingly, various modifications may be made in the form of example views by a manufacturing technology, an allowable error, and/or the like. Accordingly, the embodiments of the present disclosure should not be limited to the particular forms shown in the drawings, and include various modifications and changes made by a manufacturing process. Thus, areas illustrated in the drawings are schematic in nature, and their shapes are not intended to illustrate the precise shape of an area of an element, and thus, are not intended to limit the scope of the present disclosure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, example embodiments will be described in more detail with reference to the accompanying drawings.

Figure 2:
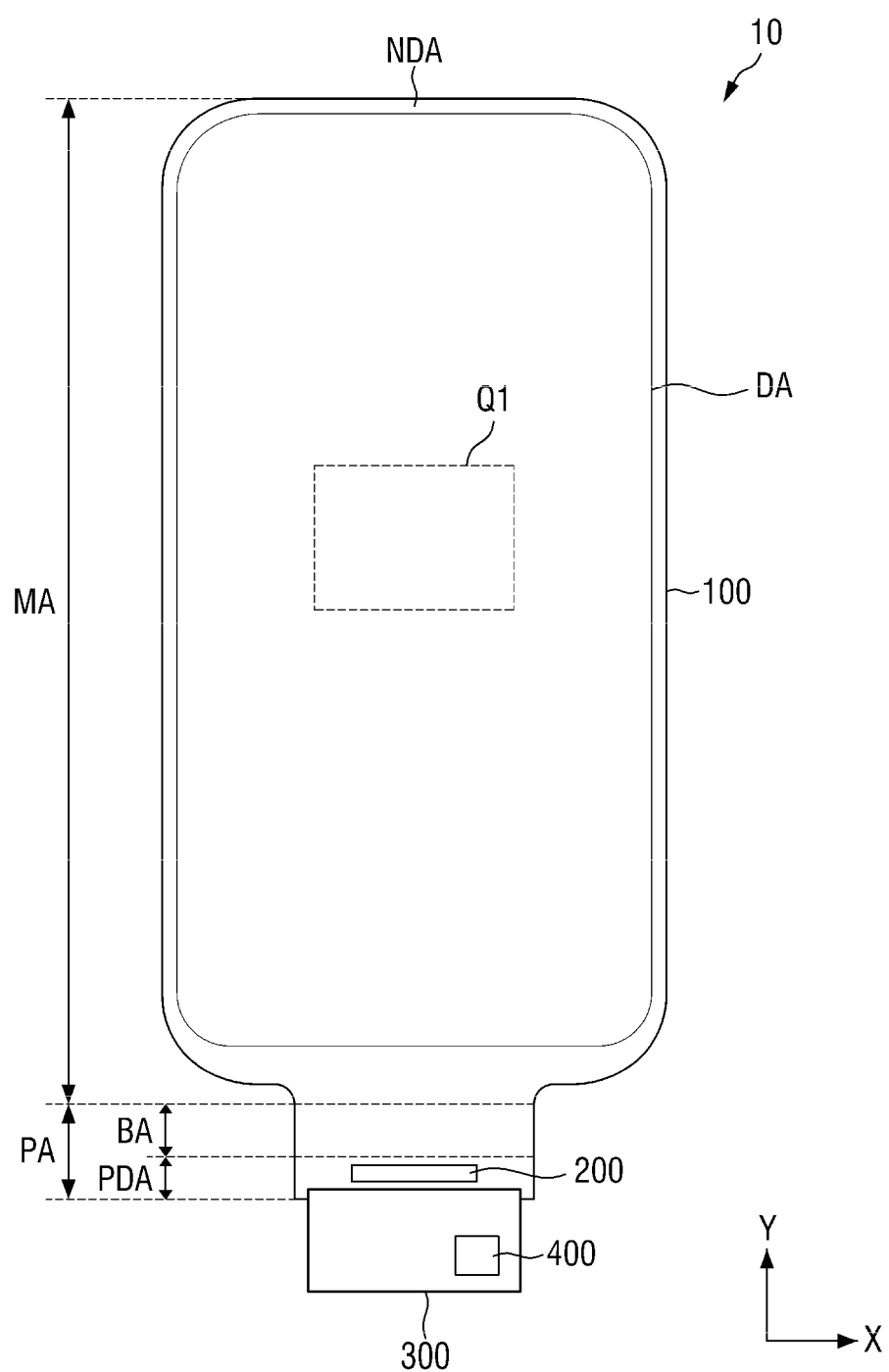
FIG. 2 is a plan view of the display device according to an embodiment.
Figure 3:
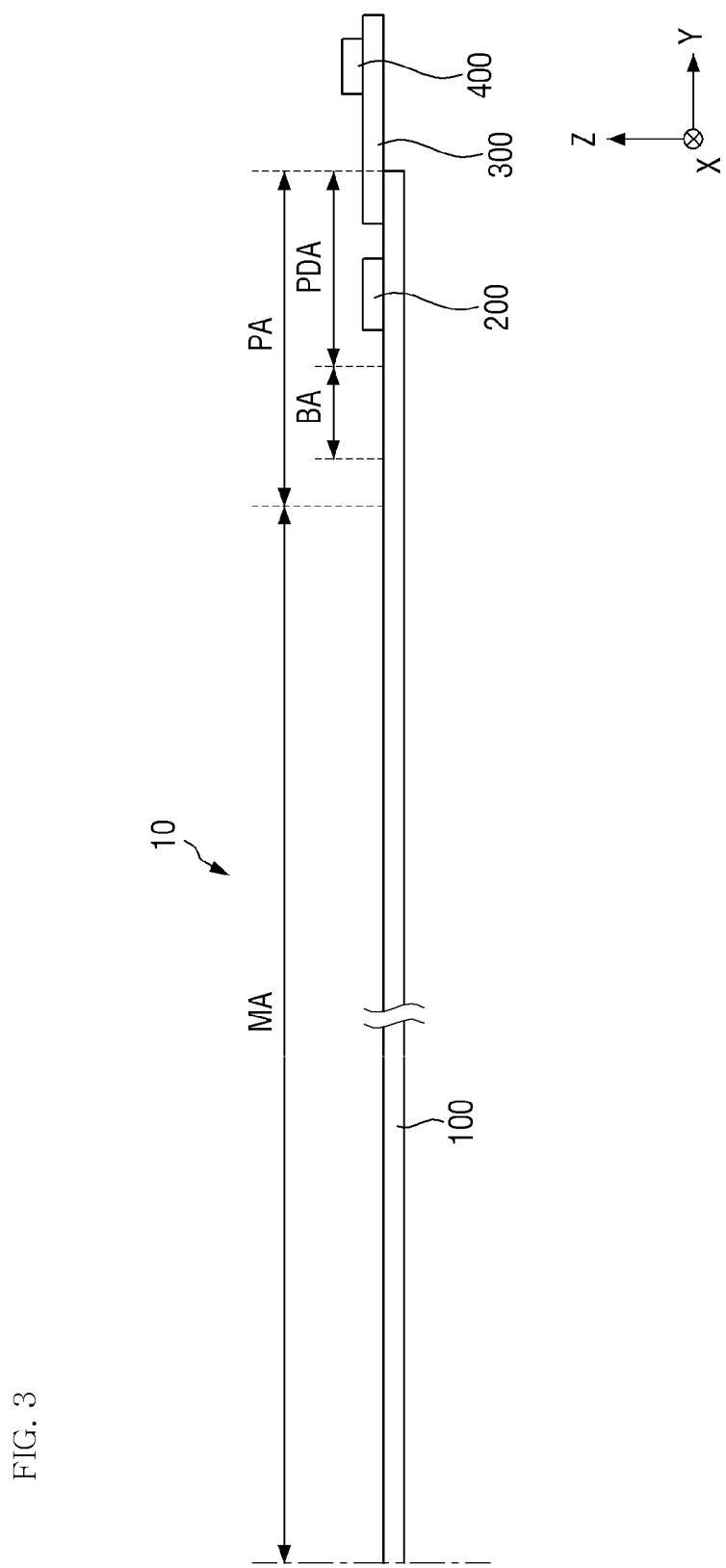
FIGS. 3-4 are side views of the display device according to an embodiment.
Figure 4:
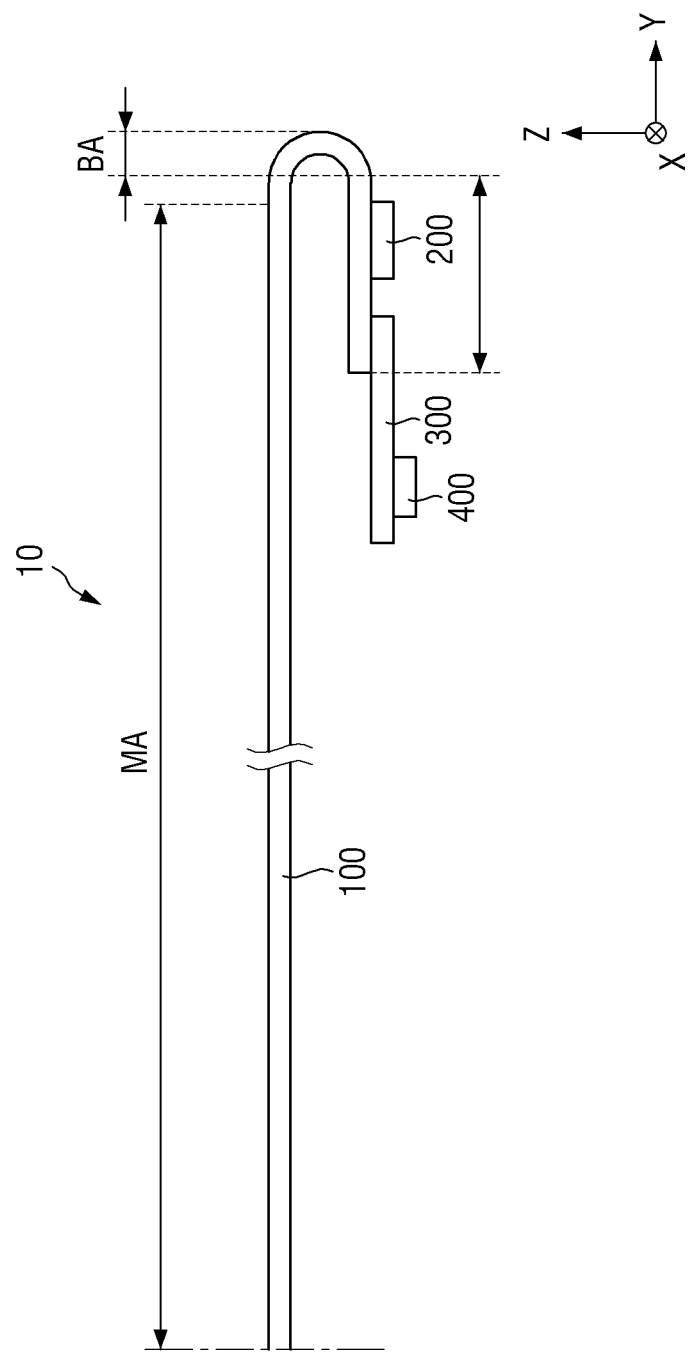

FIG. 1 is a perspective view of a display device according to an embodiment. FIG. 2 is a plan view of the display device according to an embodiment. FIGS. 3 and 4 are side views of the display device according to an embodiment.

A display device 10 may be a device for displaying still images and/or moving images, and the display device 10 may be used as a display screen for a mobile electronic device, for example, such as a mobile phone, a smartphone, a tablet personal computer (PC), a smartwatch, a watch phone, a mobile communication terminal, an electronic notebook, an electronic book, a portable multimedia player (PMP), a navigation device, or an ultra-mobile PC (UMPC)), as well as for various other suitable products, for example, such as a television, a notebook computer, a monitor, a billboard, and/or an Internet of Things (IoT) device. The display device 10 may be one of an organic light-emitting diode (OLED) display device, a liquid crystal display (LCD) device, a plasma display device, a field emission display (FED) device, an electrophoretic display (EPD) device, an electrowetting display device, a quantum dot light-emitting diode (QLED) display device, and/or a micro light-emitting diode (mLED) display device. Hereinafter, for convenience of description, the display device 10 will be described in more detail as being the OLED display device, but the present disclosure is not limited thereto.

The display device 10 according to an embodiment includes a display panel 100, a display driving circuit 200, a circuit board 300, and a touch driving circuit 400.

The display panel 100 may include a main area MA, and a protruding area PA that protrudes from one side (e.g., from one end) of the main area MA.

The main area MA may be formed to have a rectangular planar shape having short sides extending in a first direction (e.g., an X-axis direction), and long sides extending in a second direction (e.g., a Y-axis direction) crossing the first direction (e.g., the X-axis direction). A corner at which the short side extending in the first direction (the X-axis direction) meets the long side extending in the second direction (the Y-axis direction) may be formed to be rounded to have a suitable curvature (e.g., a predetermined curvature), or may be formed with a right angle. The planar shape of the display device 10 is not limited to the rectangular shape, and may be formed in another suitable polygonal shape, a circular shape, or an elliptical shape.

The main area MA may be formed to be flat or substantially flat, but the present disclosure is not limited thereto. For example, the main area MA may have curved portions formed at a left end and a right end thereof. In this case, the curved portions may have a constant curvature or a variable curvature.

The main area MA may include a display area DA, at (e.g., in or on) which pixels are formed to display an image, and a non-display area NDA, which is a peripheral area of the display area DA.

In addition to the pixels, scan lines, data lines, and power lines that are connected to the pixels may be disposed at (e.g., in or on) the display area DA. When the main area MA includes the curved portions, the display area DA may be disposed at (e.g., in or on) the curved portions. In this case, an image displayed by the display panel 100 may be viewed even at (e.g., in or on) the curved portions.

The non-display area NDA may be defined as an area ranging from (e.g., extending from) an outer side of the display area DA to an edge of the display panel 100. A scan driver for applying scan signals to the scan lines, and link lines for connecting the data lines to the display driving circuit 200 may be disposed at (e.g., in or on) the non-display area NDA.

The protruding area PA may protrude from one side (e.g., from one end) of the main area MA. For example, as illustrated in FIG. 2, the protruding area PA may protrude from a lower side (e.g., a lower end) of the main area MA. A length of the protruding area PA in the first direction (X-axis direction) may be less than a length of the main area MA in the first direction (X-axis direction).

The protruding area PA may include a bending area BA, and a pad area PDA. In this case, the pad area PDA may be disposed at one side (e.g., at one end) of the bending area BA, and the main area MA may be disposed at another side (e.g., at another end) of the bending area BA. For example, the pad area PDA may be disposed at a lower side (e.g., at a lower end) of the bending area BA, and the main area MA may be disposed at an upper side (e.g., at an upper end) of the bending area BA.

The display panel 100 may be formed to be flexible, and thus, may be flexible, bendable, foldable, and/or rollable. Accordingly, the display panel 100 may be bent in a thickness direction (e.g., a Z-axis direction) in the bending area BA. In this case, as shown in FIG. 3, before the display panel 100 is bent, one surface of the pad area PDA of the display panel 100 faces upward, but as shown in FIG. 4, after the display panel 100 is bent, the one surface of the pad area PDA of the display panel 100 faces downward. Accordingly, as shown in FIG. 4, the pad area PDA may be disposed under (e.g., underneath) the main area MA, and thus, may overlap with the main area MA.

Pads that are electrically connected to the display driving circuit 200, and the circuit board 300 may be disposed at (e.g., in or on) the pad area PDA of the display panel 100.

The display driving circuit 200 outputs signals and voltages for driving the display panel 100. For example, the display driving circuit 200 may supply data voltages to the data lines. In addition, the display driving circuit 200 may supply a power voltage to the power line, and may supply scan control signals to the scan driver. The display driving circuit 200 may be formed as an integrated circuit (IC), and may be mounted on the display panel 100 at (e.g., in or on) the pad area PDA using a chip-on-glass (COG) method, a chip-on-plastic (COP) method, or an ultrasonic bonding method, but the present disclosure is not limited thereto. For example, the display driving circuit 200 may be mounted on the circuit board 300.

The pads may include display pads that are electrically connected to the display driving circuit 200, and touch pads that are electrically connected to touch lines.

The circuit board 300 may be attached to the pads using an anisotropic conductive film. As a result, lead lines of the circuit board 300 may be electrically connected to the pads. The circuit board 300 may be a flexible printed circuit board, a printed circuit board, or a flexible film, for example, such as a chip on film.

The touch driving circuit 400 may be connected to touch electrodes of a touch sensor layer TSL of the display panel 100. The touch driving circuit 400 applies driving signals to the touch electrodes of the touch sensor layer TSL, and measures capacitance values of the touch electrodes. The driving signals may be signals having a plurality of driving pulses. The touch driving circuit 400 may not only determine whether a touch is input, but may also calculate touch coordinates to which the touch is input, on the basis of the capacitance values.

The touch driving circuit 400 may be disposed on the circuit board 300. The touch driving circuit 400 may be formed as an IC, and mounted on the circuit board 300.

Figure 5:
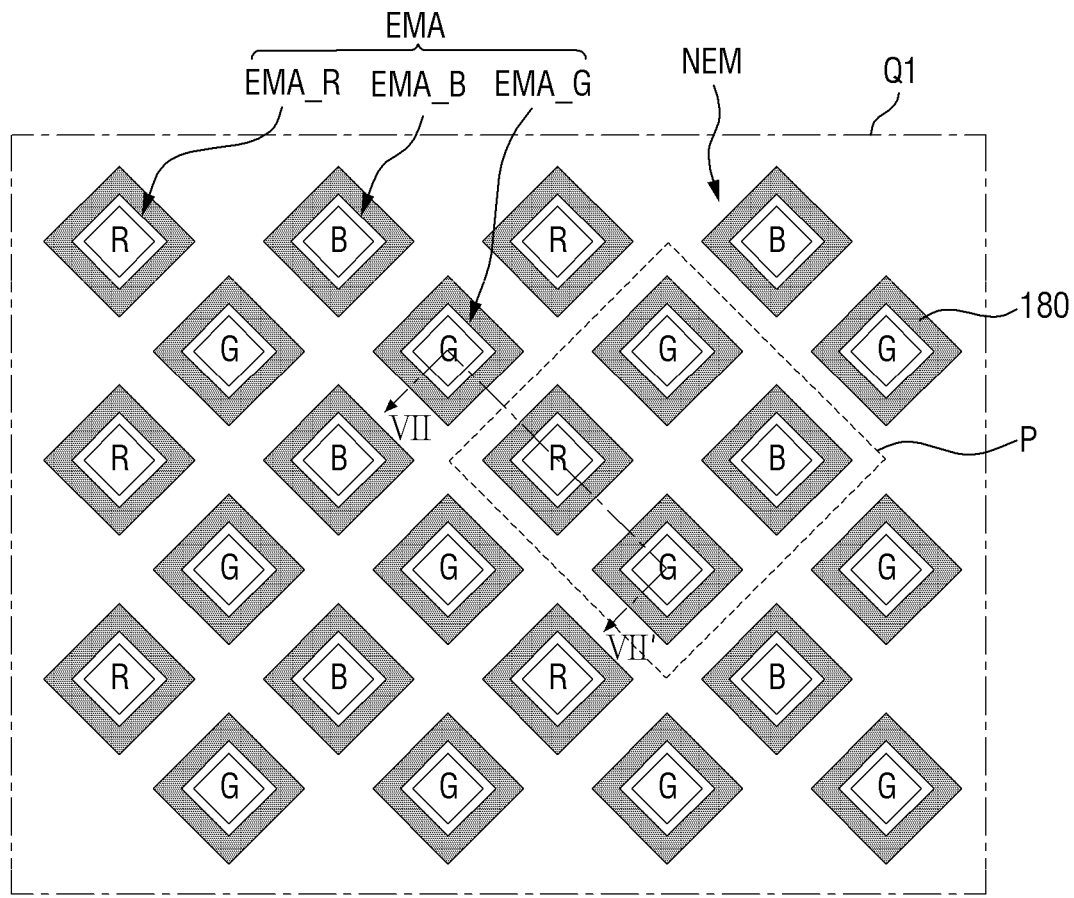
FIG. 5 is an enlarged plan view illustrating an example of the area Q1 of FIG. 2.
Figure 6:
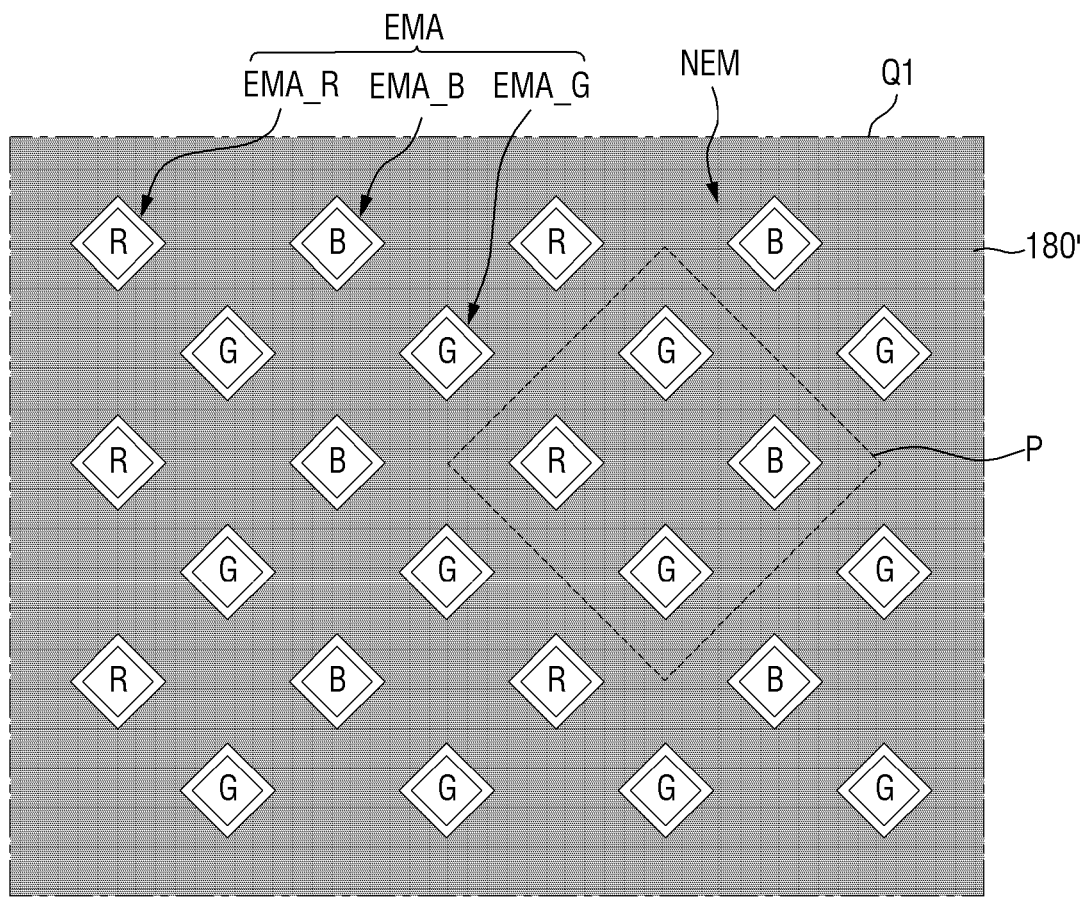
FIG. 6 is an enlarged plan view illustrating another example of the area Q1 of FIG. 2.
Figure 7:
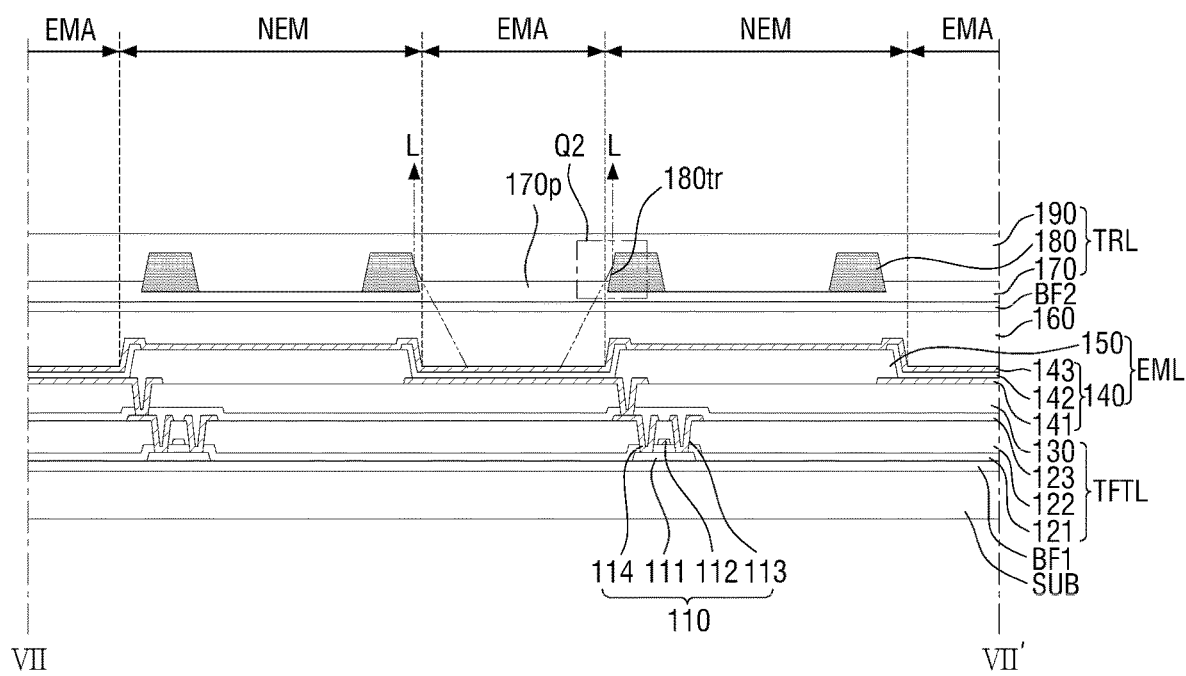
FIG. 7 is a cross-sectional view illustrating an example of a cross section taken along the line VII-VII' of FIG. 5.
Figure 8:
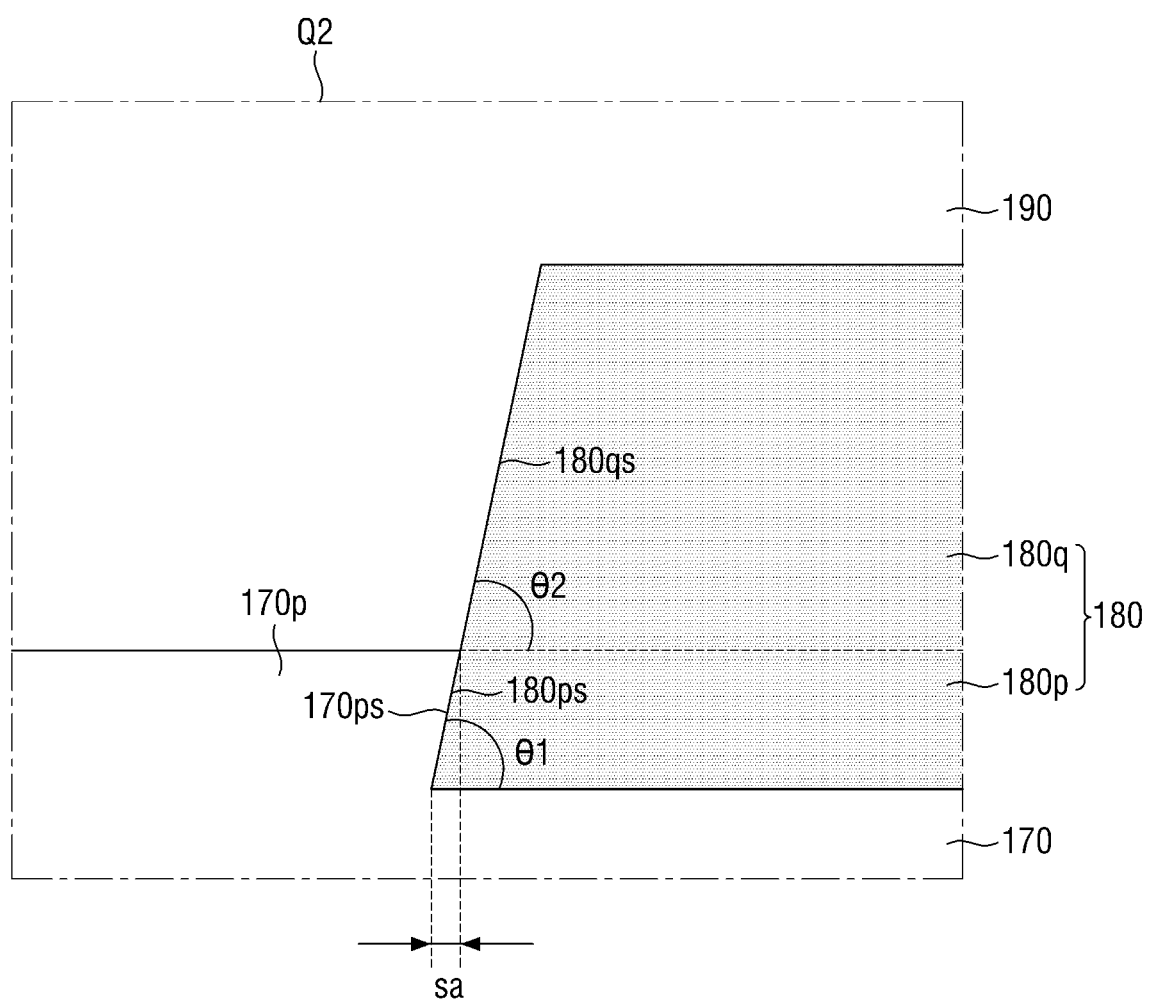
FIG. 8 is an enlarged cross-sectional view illustrating an example of the area Q2 of FIG. 7.
Figure 9:
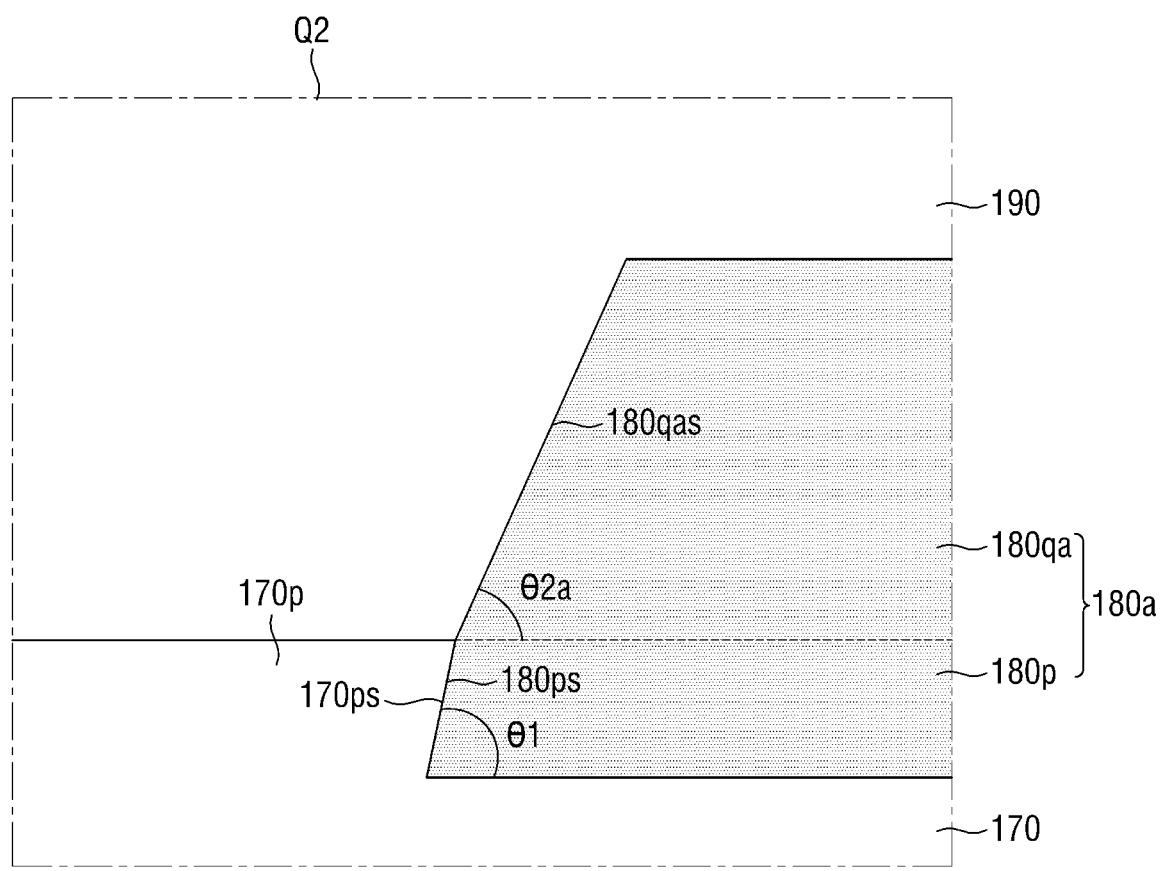
FIGS. 9-11 are enlarged cross-sectional views illustrating other examples of the area Q2 of FIG. 7.
Figure 10:
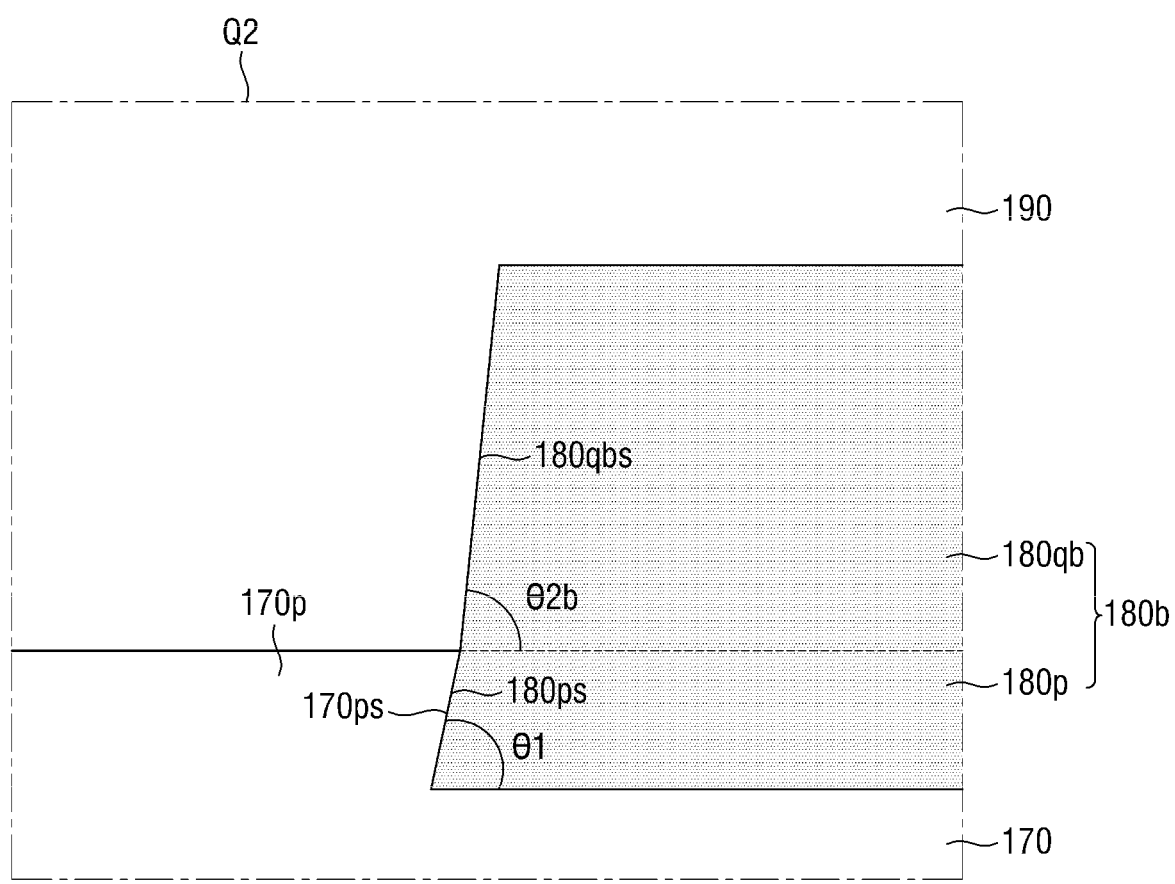
Figure 11:
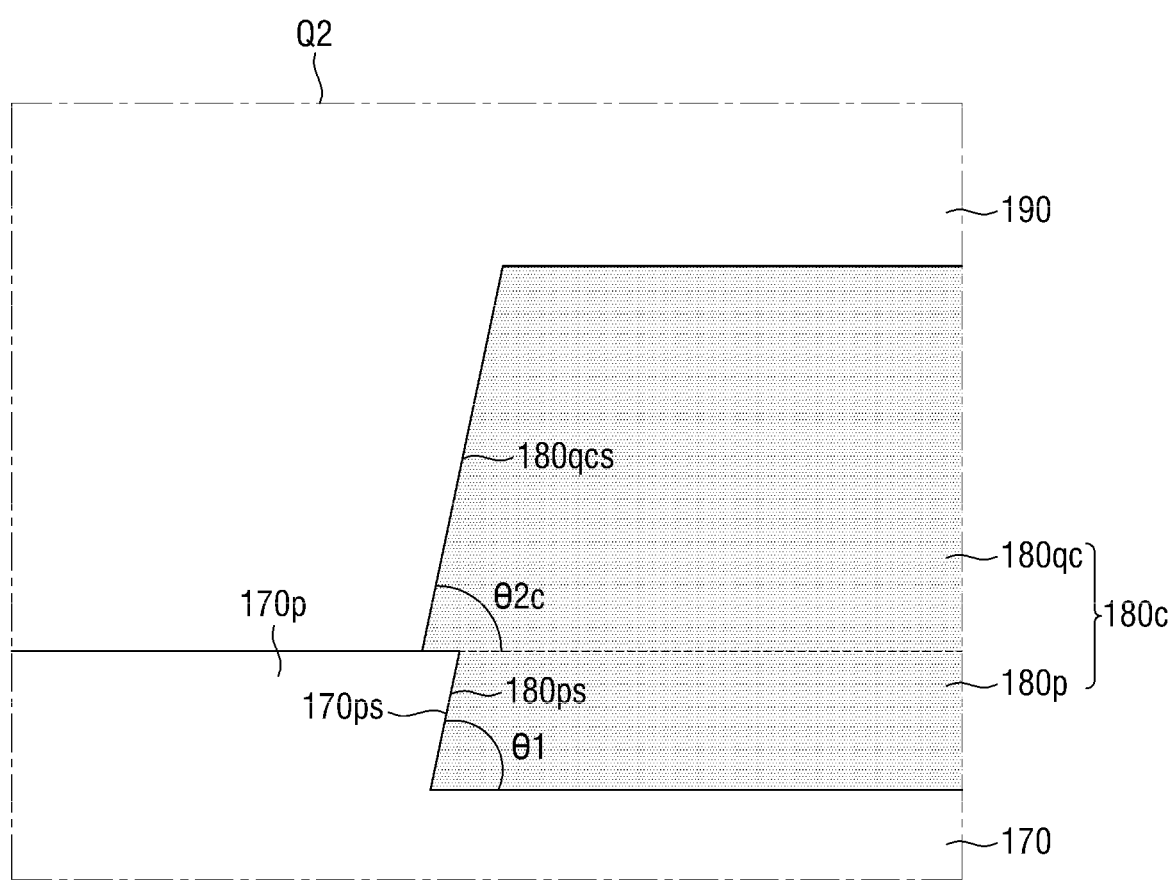
Figure 12:
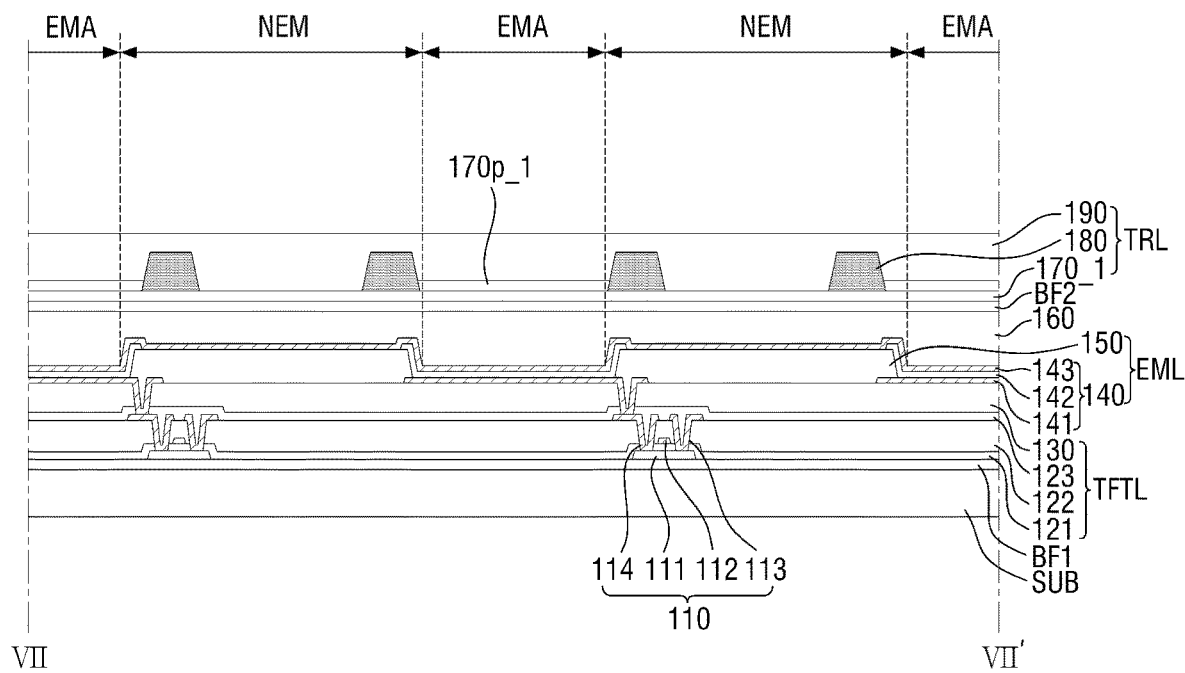
FIG. 12 is a cross-sectional view illustrating another example of a cross section taken along the line VII-VII' of FIG. 5.

FIG. 5 is an enlarged plan view illustrating an example of the area Q1 of FIG. 2. FIG. 6 is an enlarged plan view illustrating another example of the area Q1 of FIG. 2. FIG. 7 is a cross-sectional view illustrating an example of a cross section taken along the line VII-VII' of FIG. 5. FIG. 8 is an enlarged cross-sectional view illustrating an example of the area Q2 of FIG. 7. FIGS. 9 to 11 are enlarged cross-sectional views illustrating other examples of the area Q2 of FIG. 7. FIG. 12 is a cross-sectional view illustrating another example of a cross section taken along the line VII-VII' of FIG. 5.

Referring to FIGS. 5 to 12, the display area DA includes a plurality of pixels P. Each of the pixels includes a light-emitting area EMA. A non-light-emitting area NEM is disposed between the light-emitting areas EMA of the respective pixels.

The pixels P may include first color pixels, second color pixels, and third color pixels. The respective color pixels may be arranged in various suitable ways. In an embodiment, in a first row, first color pixels (for example, red pixels) and second color pixels (for example, blue pixels) may be alternately arranged along the first direction (X-axis). In a second row adjacent to the first row, third color pixels (for example, green pixels) may be arranged along the first direction (X-axis). The pixels belonging to the second row may be staggered in the first direction (X-axis) with respect to the pixels belonging to the first row. The number of the third color pixels belonging to the second row may be twice the number of the first color pixels or the number of the second color pixels belonging to the first row. The arrangements of the first row and the second row may be repeated along the second direction (Y-axis).

For example, the first color pixel may be a red subpixel R, the second color pixel may be a blue subpixel B, and the third color pixel may be a green subpixel G. One red subpixel R, one blue subpixel B, and two green subpixels G may be defined as one pixel P.

The light-emitting area EMA includes a light-emitting area EMA_R in the first color pixel, a light-emitting area EMA_B in the second color pixel, and a light-emitting area EMA_G in the third color pixel. A size of the light-emitting area EMA in each color pixel may be different from one another. For example, the light-emitting area EMA_R in the first color pixel may be greater in size than the light-emitting area EMA_B in the second color pixel, and the light-emitting area EMA_G in the third color pixel may be less in size than the light-emitting area EMA_B in the second color pixel. However, the present disclosure is not limited thereto, and the light-emitting area EMA_G in the third color pixel may be greater in size than the light-emitting area EMA_B in the second color pixel. In addition, as shown in the drawings, in some embodiments, the size of each of the light-emitting areas EMA may be the same or substantially the same as each other.

In the drawings, the planar shape of each of the light-emitting areas EMA is illustrated as being a rhombus shape as an example, but the present disclosure is not limited thereto, and the planar shape of the light-emitting area EMA of each color pixel may be variously modified. For example, the planar shape of each of the light-emitting areas EMA may be an octagonal shape, a circular shape, other suitable polygonal shapes, or a suitable polygonal shape having rounded corners.

The display area DA may further include a total reflection layer TRL (e.g., see FIG. 7) surrounding (e.g., around a periphery of) each of the light-emitting areas EMA to improve the efficiency of light output to the outside. In more detail, the total reflection layer TRL may include an inorganic layer 170, a low refractive organic layer 180, and a high refractive organic layer 190, and may reflect light traveling toward the outside from among the light emitted from the light-emitting area EMA to travel upward. Each low refractive organic layer 180 may be disposed to correspond to each (e.g., to one) light-emitting area EMA as shown in FIG. 5, but the present disclosure is not limited thereto.

As another example, as shown in FIG. 6, a low refractive organic layer 180' may extend over an entirety of, and may be formed entirely at (e.g., in or on), the non-light-emitting area NEM. In the low refractive organic layer 180', an opening may be formed in an area corresponding to each light-emitting area EMA to expose each of the subpixels R, G, and B.

Hereinafter, an overall stacked structure of the display device, and an operation principle of the total reflection layer TRL will be described in more detail with reference to FIG. 7.

The display panel 100 includes a substrate SUB. A thin-film transistor layer TFTL, a light-emitting element layer EML, a thin-film sealing layer 160, and the total reflection layer TRL are sequentially disposed on the substrate SUB.

The substrate SUB may include (e.g., may be made of) an insulating material, for example, such as glass, quartz, or a polymer resin. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a suitable combination thereof. As another example, the substrate SUB may include a metallic material.

The substrate SUB may be a rigid substrate, or a flexible substrate that is bendable, foldable, and/or rollable. When the substrate SUB is a flexible substrate, the substrate SUB may include (e.g., may be made of) polyimide (PI), but the present disclosure is not limited thereto.

The thin-film transistor layer TFTL is formed on the substrate SUB. The thin-film transistor layer TFTL includes a plurality of thin-film transistors 110, a gate insulating film 121, an interlayer insulating film 122, a protective film 123, and a planarization film 130.

A first buffer film BF1 may be formed on one surface of the substrate SUB. The first buffer film BF1 may be formed on the one surface of the substrate SUB to protect an organic light-emitting layer 142 of the light-emitting element layer EML and the thin-film transistors 110 from moisture permeating through the substrate SUB that may be vulnerable to moisture penetration. The first buffer film BF1 may include a plurality of inorganic films that are alternately stacked on one another. For example, the first buffer film BF1 may be formed as a multilayered film in which one or more inorganic films from among a silicon nitride layer, a silicon oxynitride layer, a silicon oxide layer, a titanium oxide layer, and/or an aluminum oxide layer are alternately stacked on one another. In some embodiments, the first buffer film BF1 may be omitted.

The thin-film transistors 110 are formed on the first buffer film BF1. Each of the thin-film transistors 110 includes an active layer 111, a gate electrode 112, a source electrode 113, and a drain electrode 114. In FIG. 7, each of the thin-film transistors 110 is illustrated as being formed in a top-gate kind in which the gate electrode 112 is located above the active layer 111, but the present disclosure is not limited thereto. In other words, each of the thin-film transistors 110 may also be formed in a bottom-gate kind in which the gate electrode 112 is located below the active layer 111, or a double-gate kind in which the gate electrode 112 is located both above and below the active layer 111.

The active layer 111 is formed on the first buffer film BF1. The active layer 111 may include polycrystalline silicon, single crystal silicon, low temperature polycrystalline silicon, amorphous silicon, or an oxide semiconductor. For example, the oxide semiconductor may include a binary compound (ABx), a ternary compound (ABxCy), or a quaternary compound (ABxCyDz), which includes indium, zinc, gallium, tin, titanium, aluminum, hafnium (Hf), zirconium (Zr), magnesium (Mg), and/or the like. For example, the active layer 111 may include ITZO (e.g., an oxide including indium, tin, and titanium), or IGZO (e.g., an oxide including indium, gallium, and tin). In some embodiments, a light-blocking layer configured to block external light incident on the active layer 111 may be formed between the first buffer film BF1 and the active layer 111.

The gate insulating film 121 may be formed on the active layer 111. The gate insulating film 121 may be formed as an inorganic film, for example, such as a silicon nitride layer, a silicon oxynitride layer, a silicon oxide layer, a titanium oxide layer, or an aluminum oxide layer.

The gate electrode 112 and a gate line may be formed on the gate insulating film 121. Each of the gate electrode 112 and the gate line may be formed as a single layer or multilayers including (e.g., made of) at least one selected from among molybdenum (Mo), aluminum (Al), chromium (Cr), gold (Au), titanium (Ti), nickel (Ni), neodymium (Nd), copper (Cu), or a suitable alloy thereof.

The interlayer insulating film 122 may be formed on the gate electrode 112 and the gate line. The interlayer insulating film 122 may be formed as an inorganic film, for example, such as a silicon nitride layer, a silicon oxynitride layer, a silicon oxide layer, a titanium oxide layer, or an aluminum oxide layer.

The source electrode 113 and the drain electrode 114 may be formed on the interlayer insulating film 122. Each of the source electrode 113 and the drain electrode 114 may be connected to the active layer 111 through a contact hole passing through (e.g., penetrating) the gate insulating film 121 and the interlayer insulating film 122. Each of the source electrode 113 and the drain electrode 114 may be formed as a single layer or multilayers including (e.g., made of) at least one selected from among molybdenum (Mo), aluminum (Al), chromium (Cr), gold (Au), titanium (Ti), nickel (Ni), neodymium (Nd), copper (Cu), and/or a suitable alloy thereof.

The protective film 123 for insulating the thin-film transistor 110 may be formed on the source electrode 113 and the drain electrode 114. The protective film 123 may be formed as an inorganic film, for example, such as a silicon nitride layer, a silicon oxynitride layer, a silicon oxide layer, a titanium oxide layer, or an aluminum oxide layer.

The planarization film 130 may be formed on the protective film 123 to planarize or substantially planarize a step difference due to the thin-film transistor 110. The planarization film 130 may be formed as an organic film including (e.g., made of) an acryl resin, an epoxy resin, a phenolic resin, a polyamide resin, or a polyimide resin.

The light-emitting element layer EML may be formed on the thin-film transistor layer TFTL. The light-emitting element layer EML may include light-emitting elements 140, and a bank layer 150.

The light-emitting elements 140 and the bank layer 150 are formed on the planarization film 130. Each of the light-emitting elements 140 may include a first electrode 141, the organic light-emitting layer 142, and a second electrode 143.

The first electrode 141 may be formed on the planarization film 130. The first electrode 141 is connected to the drain electrode 114 of the thin-film transistor 110 through a contact hole passing through (e.g., penetrating) the protective film 123 and the planarization film 130.

In a top emission structure in which light is emitted in a direction towards the second electrode 143 with respect to the organic light-emitting layer 142, the first electrode 141 may include (e.g., may be made of) a conductive material (e.g., a conductive metallic material) having high reflectivity, for example, such as a stacked structure of aluminum and titanium (e.g., Ti/Al/Ti), a stacked structure of aluminum and indium tin oxide (ITO) (e.g., ITO/Al/ITO), a silver-palladium-copper (APC) alloy, and/or a stacked structure of ITO and an APC alloy (e.g., ITO/APC/ITO). The APC alloy may be an alloy of silver (Ag), palladium (Pd), and copper (Cu).

In a bottom emission structure in which light is emitted in a direction towards the first electrode 141 with respect to the organic light-emitting layer 142, the first electrode 141 may include (e.g., may be made of) a transparent conductive material (TCO) capable of transmitting light, for example, such as ITO or indium zinc oxide (IZO), or may include (e.g., may be made of) a semi-transmissive conductive material, for example, such as magnesium (Mg), silver (Ag), or a suitable alloy of magnesium (Mg) and silver (Ag). In this case, when the first electrode 141 includes (e.g., is made of) a semi-transmissive conductive material, light output efficiency may be increased by a microcavity.

The bank layer 150 may be formed to partition the first electrode 141 on the planarization film 130, and to serve as a bank layer for defining each subpixel R, G, and B. The bank layer 150 may be formed to cover an edge of the first electrode 141. The bank layer 150 may be formed as an organic film including (e.g., made of) an acryl resin, an epoxy resin, a phenolic resin, a polyamide resin, or a polyimide resin.

Each of the subpixels R, G, and B refers to an area in which the first electrode 141, the organic light-emitting layer 142, and the second electrode 143 are sequentially stacked on one another, and holes from the first electrode 141 and electrons from the second electrode 143 are combined with each other in the organic light-emitting layer 142 to emit light.

The organic light-emitting layer 142 is formed on the first electrode 141 and the bank layer 150. The organic light-emitting layer 142 may include an organic material to emit a suitable or desired color (e.g., a predetermined or certain color) of light. For example, the organic light-emitting layer 142 may include a hole transporting layer, an organic material layer, and an electron transporting layer. In this case, the organic light-emitting layer 142 of the red subpixel R may emit red light, the organic light-emitting layer 142 of the green subpixel G may emit green light, and the organic light-emitting layer 142 of the blue subpixel B may emit blue light. However, the present disclosure is not limited thereto, and the organic light-emitting layers 142 of the subpixels R, G, and B may emit white light, and in this case, the red subpixel R may further include a red color filter layer, the green subpixel G may further include a green color filter layer, and the blue subpixel B may further include a blue color filter layer.

The second electrode 143 is formed on the organic light-emitting layer 142. The second electrode 143 may be formed to cover the organic light-emitting layer 142. The second electrode 143 may be a common layer that is commonly formed in the pixels P. In some embodiments, a capping layer configured to protect the second electrode 143 may be further formed on the second electrode 143.

In the top emission structure, the second electrode 143 may include (e.g., may be made of) a transparent conductive material (TCO) capable of transmitting light, for example, such as ITO or IZO, or may include (e.g., may be made of) a semi-transmissive conductive material, for example, such as magnesium (Mg), silver (Ag), or an alloy of magnesium (Mg) and silver (Ag). When the second electrode 143 includes (e.g., is made of) a semi-transmissive conductive material, light output efficiency may be increased by a microcavity.

The thin-film sealing layer 160 is formed on the light-emitting element layer EML.

The thin-film sealing layer 160 is disposed on the second electrode 143. The thin-film sealing layer 160 may include at least one inorganic film to prevent or substantially prevent oxygen and/or moisture from penetrating into the organic light-emitting layer 142 and the second electrode 143. In addition, the thin-film sealing layer 160 may include at least one organic film to protect the light-emitting element layer EML from foreign substances, for example, such as dust. For example, the thin-film sealing layer 160 may include a first sealing inorganic film disposed on the second electrode 143, a sealing organic film disposed on the first sealing inorganic film, and a second sealing inorganic film disposed on the sealing organic film. The first sealing inorganic film and the second sealing inorganic film may be formed as a silicon nitride layer, a silicon oxynitride layer, a silicon oxide layer, a titanium oxide layer, or an aluminum oxide layer, but the present disclosure is not limited thereto. The sealing organic film may include (e.g., may be made of) an acryl resin, an epoxy resin, a phenolic resin, a polyamide resin, a polyimide resin, or the like, but the present disclosure is not limited thereto.

The total reflection layer TRL may be disposed on the thin-film sealing layer 160. The total reflection layer TRL includes the inorganic layer 170, the low refractive organic layer 180, and the high refractive organic layer 190. The low refractive organic layer 180 and the high refractive organic layer 190 are disposed on the inorganic layer 170. The inorganic layer 170 may include a base part disposed on the thin-film sealing layer 160, and a protruding pattern part 170p protruding from the base part in the thickness direction.

A second buffer film BF2 may be formed entirely on the thin-film sealing layer 160. The second buffer film BF2 may be disposed directly on the thin-film sealing layer 160 to more firmly protect the organic light-emitting layer 142 from moisture penetrating from the outside, and to provide a space at (e.g., in or on) which the above-described total reflection layer TRL is disposed. In some embodiments, when a touch sensor layer is further disposed on the thin-film sealing layer 160, a space at (e.g., in or on) which the touch sensor layer is disposed may be provided. Some embodiments in which the touch sensor layer is further disposed will be described in more detail below with reference to FIGS. 17 to 22.

The second buffer film BF2 may be formed as a single layer film including an inorganic material. For example, the second buffer film BF2 may be formed as a single layer film including one material from among silicon nitride, silicon oxynitride, silicon oxide, titanium oxide, and/or aluminum oxide. For example, the second buffer film BF2 may include silicon nitride, and may be formed to have a thickness of 2000 Å or approximately (e.g., about) 2000 Å. However, the present disclosure is not limited thereto, and in some embodiments, the second buffer film BF2 may be formed as a multilayered film including a plurality of inorganic materials, or may be omitted.

The inorganic layer 170 including the protruding pattern part 170p may be disposed on the second buffer film BF2.

The inorganic layer 170 may be formed entirely on the second buffer film BF2 to cover the thin-film sealing layer 160. In some embodiments, when the touch sensor layer is disposed on the thin-film sealing layer 160, the inorganic layer 170 may serve as an insulating layer that insulates a first metal layer and a second metal layer from each other, which are included in the touch sensor layer. Further, in this case, in the inorganic layer 170, a contact hole exposing the first metal layer may be formed through (e.g., may be formed to penetrate) the inorganic layer 170.

The inorganic layer 170 may be formed as a single layer film including an inorganic material. For example, the inorganic layer 170 may be formed as a single layer film including one material from among silicon nitride, silicon oxynitride, silicon oxide, titanium oxide, and/or aluminum oxide. For example, the inorganic layer 170 may include silicon nitride, and may be formed to have a thickness of 3000 Å in an area other than the protruding pattern part 170*p*. However, the present disclosure is not limited thereto, and in some embodiments, the inorganic layer 170 may be formed as a multilayered film including a plurality of inorganic materials, or may be omitted.

The protruding pattern part 170*p* may be a supporting layer for securing a process stability during the formation of the low refractive organic layer 180, which will be described in more detail below. In more detail, the protruding pattern part 170*p* may support a lateral surface (e.g., a side surface) of the low refractive organic layer 180, so that the shape of the low refractive organic layer 180 may not collapse during a photolithography process when the low refractive organic layer 180 is formed. In a case in which the protruding pattern part 170*p* is not disposed, an undercut or a residual film may be formed on a lower portion of the low refractive organic layer 180 during a photolithography process to lower a processability thereof.

Opposite cross-sectional lateral surfaces of the protruding pattern part 170*p* may each have a reverse tapered shape or substantially a reverse tapered shape, and thus, at least a portion of a total reflection surface of the low refractive organic layer 180 may be supported thereby to have an inclined surface. In other words, the cross-sectional shape of the protruding pattern part 170*p* may be a reverse trapezoidal shape, but the present disclosure is not limited thereto, and the cross-section shape of the protruding pattern part 170*p* may be a triangular shape, one of various suitable polygonal shapes, or a shape having a curved surface. The shape of the low refractive organic layer 180 disposed on the protruding pattern part 170*p* may be variously modified according to the cross-sectional shape of the protruding pattern part 170*p*.

The protruding pattern part 170*p* may overlap with the light-emitting area EMA in a direction that is perpendicular to or substantially perpendicular to the substrate SUB. A width of the protruding pattern part 170*p* may be equal to or greater than a width of the light-emitting area EMA. In some embodiments, at least a portion of the protruding pattern part 170*p* may overlap with the non-light-emitting area NEM.

Further, in some embodiments, the inorganic layer 170 may further include the protruding pattern part 170*p* that is disposed entirely thereon, even at (e.g., in or on) the non-light-emitting area NEM.

The protruding pattern part 170*p* may be formed by various suitable methods. In an embodiment, the protruding pattern part 170*p* may be a part formed by stacking the inorganic layer 170 having a large thickness, and then removing a portion of the inorganic layer 170 such that an area overlapping with the light-emitting area EMA protrudes. In this case, the protruding pattern part 170*p* may be a part protruding from an upper surface of the inorganic layer 170, and the inorganic layer 170 and the protruding pattern part 170*p* may be in contact with each other without a physical boundary therebetween. However, the protruding pattern part 170*p* is not limited thereto, and as another example, the protruding pattern part 170*p* may be formed as a separate layer from that of the inorganic layer 170.

In the case where the protruding pattern part 170*p* is formed by removing a portion of the inorganic layer 170, the protruding pattern part 170*p* may include the same material as that of the inorganic layer 170. In other words, the protruding pattern part 170*p* may be formed as a single layer film including an inorganic material. An example of the inorganic material may be the same as that of the inorganic material included in the inorganic layer 170 described above, and thus, redundant description thereof may not be repeated.

The protruding pattern part 170*p* may be formed to have a thickness of 1000 Å to 5000 Å from the upper surface of the inorganic layer 170 on which the protruding pattern part 170*p* is not formed, but the present disclosure is not limited thereto, and the protruding pattern part 170*p* may have a greater thickness. As an example, the protruding pattern part 170*p* may have a thickness of approximately 2000 Å from the upper surface of the inorganic layer 170. In other words, the maximum thickness of the inorganic layer 170 (e.g., including the thickness of the protruding part 170*p*) may be in a range of 4000 Å to 8000 Å.

In some embodiments, unlike the embodiment described above, the protruding pattern part 170*p* may be formed as a separate layer from the inorganic layer 170. FIG. 12 shows an example embodiment in which a protruding pattern part 170*p*_1 is formed on an inorganic layer 170_1 as a separate layer from that of the inorganic layer 170_1. In this case, the inorganic layer 170_1 may be disposed to have a uniform or substantially uniform thickness along a surface of the second buffer film BF2, and the protruding pattern part 170*p*_1 may be disposed as a separate layer to overlap with the light-emitting area EMA.

When the protruding pattern part 170*p*_1 is disposed as a separate layer from that of the inorganic layer 170_1, a thickness of the protruding pattern part 170*p*_1 may be freely adjusted, and the protruding pattern part 170*p*_1 may be formed of an inorganic material that is different from that of the inorganic layer 170_1. Accordingly, the shape of the low refractive organic layer 180 disposed on the inorganic layer 170_1 and the protruding pattern part 170*p*_1 may be more variously designed (e.g., may be more variously modified).

The low refractive organic layer 180 and the high refractive organic layer 190 may be disposed on the inorganic layer 170.

The low refractive organic layer 180 may be disposed to be adjacent to the light-emitting area EMA, and may direct light upward to the outside, from among the light emitted from the light-emitting area EMA that is incident on the low refractive organic layer 180. The low refractive organic layer 180 may have a lower refractive index than those of the above-described inorganic layer 170 and the high refractive organic layer 190, which will be described in more detail below. For example, the inorganic layer 170 may have a refractive index of 1.89, and the low refractive organic layer 180 may have a refractive index of 1.51.

In addition, the low refractive organic layer 180 may include a total reflection surface 180*tr* having a slope at the lateral surface thereof that is adjacent to the light-emitting area EMA. Light L that is incident on the total reflection surface 180*tr* may be reflected and output (e.g., directed) upward.

In an embodiment, the low refractive organic layer 180 may be disposed to be adjacent to the light-emitting area EMA, may not overlap with the light-emitting area EMA in a direction perpendicular to or substantially perpendicular to the substrate SUB, and may overlap with the non-light-emitting area NEM. When the low refractive organic layer 180 does not overlap with the light-emitting area EMA, a light output path at (e.g., in or on) the light-emitting area EMA may not be blocked, so that the light output efficiency is not reduced, and outward-directed light may be effectively output (e.g., directed) upward.

The low refractive organic layer 180 may include an organic material. For example, the low refractive organic layer 180 may be formed as a single layer film including an organic material, for example, such as an acrylic resin, an epoxy resin, a phenolic resin, a polyamide resin, or a polyimide resin, but the present disclosure is not limited thereto. In an embodiment, the low refractive organic layer 180 may be formed as an acrylic transparent organic film having a thickness of 3 μm or approximately 3 μm (e.g., about 3 μm).

The structure of each of the inorganic layer 170 and the low refractive organic layer 180 will be described in more detail with reference to FIGS. 8 to 11. As described above, the low refractive organic layer 180 may be disposed on the inorganic layer 170, and the high refractive organic layer 190 may be disposed on the low refractive organic layer 180.

Referring to FIG. 8, the low refractive organic layer 180 may include a lower low refractive organic layer 180p, and an upper low refractive organic layer 180q. In more detail, the lower low refractive organic layer 180p may be a part that is supported by the protruding pattern part 170p of the inorganic layer 170, and the upper low refractive organic layer 180q may be a part that is not supported by the protruding pattern part 170p.

At least a portion of the lower low refractive organic layer 180p may be disposed in a protective area sa, which is an area supported by a lateral surface 170ps of the protruding pattern part 170p. The lower low refractive organic layer 180p may be protected by the protective area sa, and for example, may minimize or reduce the occurrence of an undercut or residual film, which may be formed when an organic material is formed on an inorganic material. In other words, the process stability may be improved when the low refractive organic layer 180 is formed.

Further, even when the low refractive organic layer 180 is subjected to an external force in a subsequent process after the low refractive organic layer 180 is formed, the shape of the low refractive organic layer 180 may be maintained or substantially maintained without being collapsed, so that the reliability of optical properties may also be improved.

The lower low refractive organic layer 180p may include a first tapered surface 180ps that is in contact with the lateral surface 170ps of the protruding pattern part 170p. The first tapered surface 180ps may have a first taper angle θ1 with respect to a bottom surface of the lower low refractive organic layer 180p. The first taper angle θ1 may be in a range of 60° to 85°, and in an embodiment, may be in a range of 70° to 75°, so that the first tapered surface 180ps effectively reflects light emitted from the light-emitting element 140.

The upper low refractive organic layer 180q may include a second tapered surface 180qs that is in contact with the high refractive organic layer 190. The second tapered surface 180qs may have a second taper angle θ2 with respect to an extension line corresponding to (e.g., extending from) an upper surface of the protruding pattern part 170p. The second taper angle θ2 may also be in a range of 60° to 85°, and in an embodiment, may be in a range of 70° to 75°, like that of the first taper angle θ1.

The first taper angle θ1 and the second taper angle θ2 may be equal to or substantially equal to each other, but the present disclosure is not limited thereto. For example, the first taper angle θ1 of the lower low refractive organic layer 180p may be determined by the protruding pattern part 170p of the inorganic layer 170, and the second taper angle θ2 of the upper low refractive organic layer 180q may be variously modified depending on the process of forming the low refractive organic layer 180. In other words, the second taper angle θ2 may be different from the first taper angle θ1. FIGS. 9 and 10 show examples of a structure in which the second taper angle θ2 is different from the first taper angle θ1.

An upper low refractive organic layer 180qa of FIG. 9 includes a second tapered surface 180qas having a second taper angle θ2a that is less than the first taper angle θ1. Because the second tapered surface 180qas has a smaller slope than that of the first tapered surface 180ps, light having an incident angle that is greater than the taper angle of the first tapered surface 180ps may be totally reflected and output (e.g., directed) upward.

An upper low refractive organic layer 180qb of FIG. 10 includes a second tapered surface 180qbs having a second taper angle θ2b that is greater than the first taper angle θ1. Because the second tapered surface 180qbs has a greater slope than that of the first tapered surface 180ps, even light having an incident angle that is less than the taper angle of the first tapered surface 180ps may be incident on the second tapered surface 180qbs, such that the light may be totally reflected and output (e.g., directed) upward.

In other words, in a case in which the first tapered surface 180ps and the second tapered surface 180qas or 180qbs have different slopes from each other as in the examples of FIGS. 9 and 10, incident light having various incident angles may be output (e.g., may be directed) upward even more than a case in which the first tapered surface 180ps and the second tapered surface 180qas or 180qbs have the same or substantially the same slope as each other.

The first tapered surface 180ps of the lower low refractive organic layer 180p and the second tapered surface 180qs of the upper low refractive organic layer 180q may form the above-described total reflection surface 180tr of the low refractive organic layer 180.

One end of the first tapered surface 180ps of the lower low refractive organic layer 180p and one end of the second tapered surface 180qs of the upper low refractive organic layer 180q may be in contact with each other as illustrated in FIGS. 8 to 10, but the present disclosure is not limited thereto, and the first tapered surface 180ps and the second tapered surface 180qs may not be in contact with each other. In other words, the first tapered surface 180ps and the second tapered surface 180qs may not be aligned with each other.

FIG. 11 shows an example of a structure in which the first tapered surface 180ps of the lower low refractive organic layer 180p and a second tapered surface 180qcs of an upper low refractive organic layer 180qc are not aligned with each other. When the upper low refractive organic layer 180qc is not sufficiently removed during a process of forming the low refractive organic layer 180c, the second tapered surface 180qcs may protrude outward as shown in the example of FIG. 11. However, the present disclosure is not limited to the case in which the second tapered surface 180qcs protrudes further outward than the first tapered surface 180ps, and the second tapered surface 180qcs may be indented further inward than the first tapered surface 180ps depending on a process of forming the low refractive organic layer 180c.

Further, a second taper angle θ2c of the second tapered surface 180qcs and the first taper angle θ1 may be equal to or substantially equal to each other, but the present disclosure is not limited thereto, and the second taper angle θ2c and the first taper angle θ1 may be different from each other as shown in FIGS. 9 and 10.

Hereinafter, for convenience of description, the low refractive organic layer 180 in which the first taper angle θ1 is equal to or substantially equal to the second taper angle θ2, and the first tapered surface 180ps and the second tapered surface 180qs are aligned with each other as shown in the structure illustrated in FIG. 8 will be described in more detail. However, the structure illustrated in FIGS. 9 to 11 may be applied to any suitable embodiments (e.g., all of the embodiments) that are described in more detail below.

Referring to FIG. 7 again, the high refractive organic layer 190 may be disposed on the inorganic layer 170 and the low refractive organic layer 180. The high refractive organic layer 190 may be formed to cover the inorganic layer 170 and the low refractive organic layer 180, so that the total reflection layer TRL disposed on the thin-film sealing layer 160 may be planarized or substantially planarized (e.g., may be generally planarized).

The high refractive organic layer 190 may include (e.g., may be made of) a material having a higher refractive index than that of the low refractive organic layer 180. For example, the low refractive organic layer 180 may have a refractive index of 1.51, and the high refractive organic layer 190 may have a refractive index of 1.65. In other words, light that is incident on an interface between the high refractive organic layer 190 and the low refractive organic layer 180 may be totally reflected and output (e.g., directed) upward.

The high refractive organic layer 190 may include an organic material. For example, the high refractive organic layer 190 may be formed as a single layer film including an organic material, for example, such as an acrylic resin, an epoxy resin, a phenolic resin, a polyamide resin, or a polyimide resin, but the present disclosure is not limited thereto as long as the organic material of the high refractive organic layer 190 is an organic material having a refractive index that is higher than that of the low refractive organic layer 180.

The high refractive organic layer 190 may be formed to have a thickness of 5 μm or more from the upper surface of the inorganic layer 170. In other words, the high refractive organic layer 190 may be formed to be thicker than the low refractive organic layer 180.

Hereinafter, some other embodiments of the display device will be described in more detail. In the following embodiments, the components, elements, and layers that are the same or substantially the same as those in the above-described embodiments will be referred to with the same reference symbols, and thus, redundant description thereof may not be repeated or may be simplified, and the differences therebetween will be mainly described in more detail.

The embodiments of FIGS. 13 to 16 may be different from the embodiments of FIGS. 5 to 12, in that a low refractive organic layer 180_2 includes a first low refractive organic layer 181_2 and a second low refractive organic layer 182_2. Hereinafter, the differences from the above-described embodiments will be mainly described in more detail.

Figure 13:
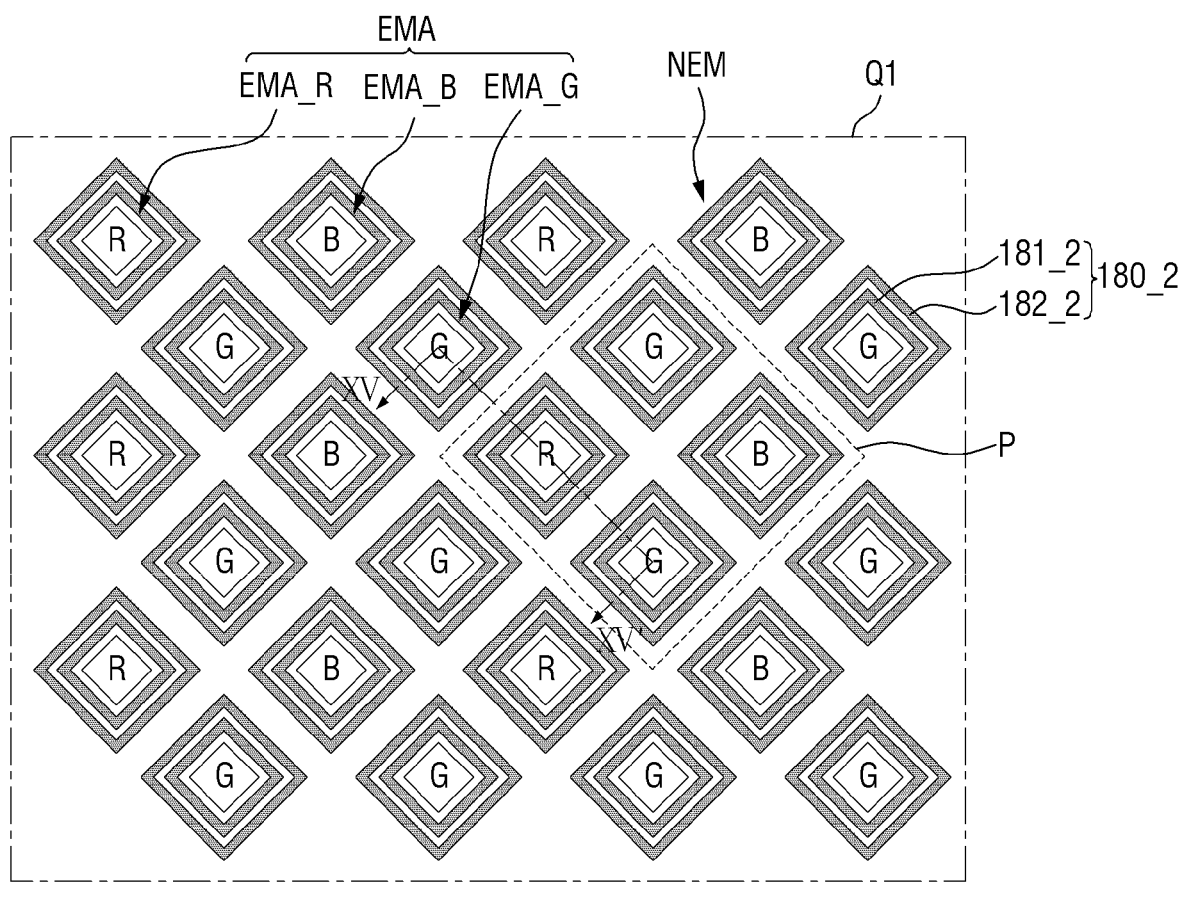
FIG. 13 is an enlarged plan view illustrating another example of the area Q1 of FIG. 2.
Figure 14:
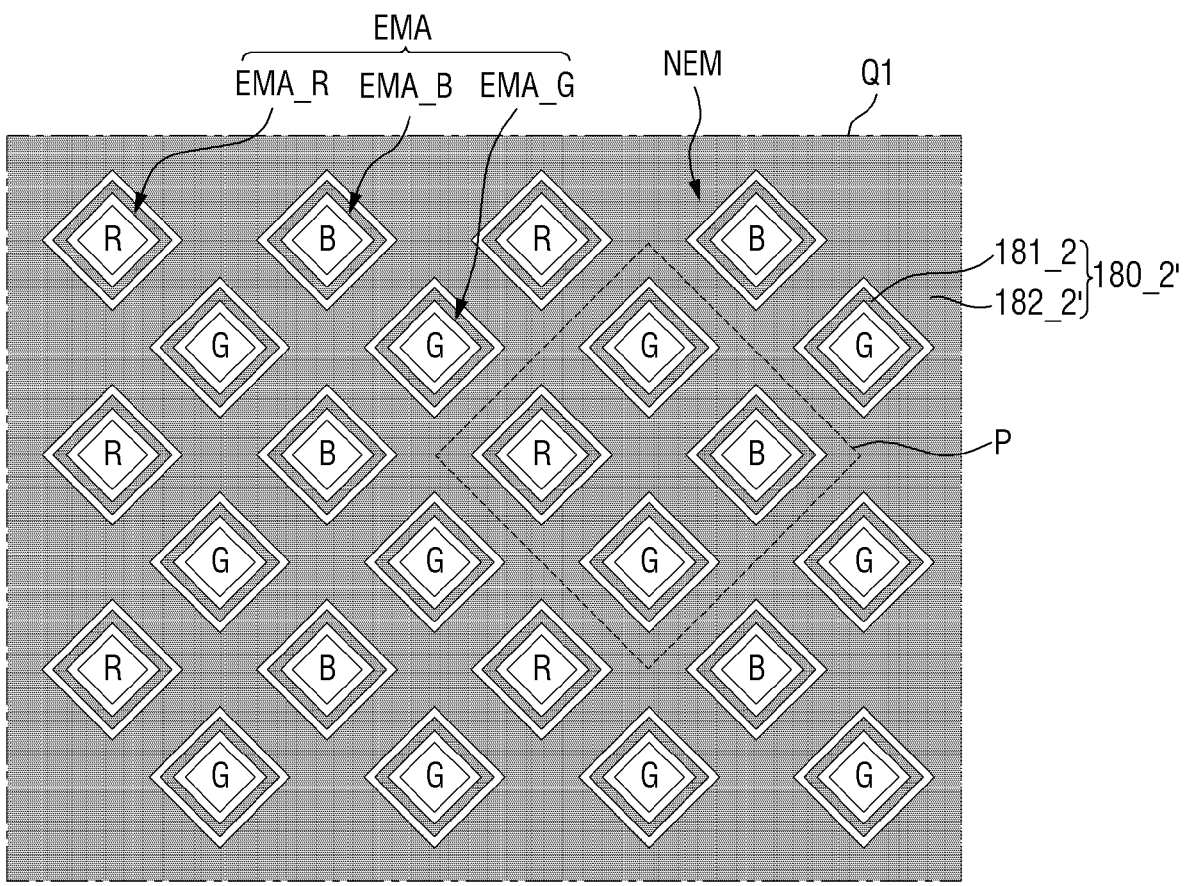
FIG. 14 is an enlarged plan view illustrating another example of the area Q1 of FIG. 2.
Figure 15:
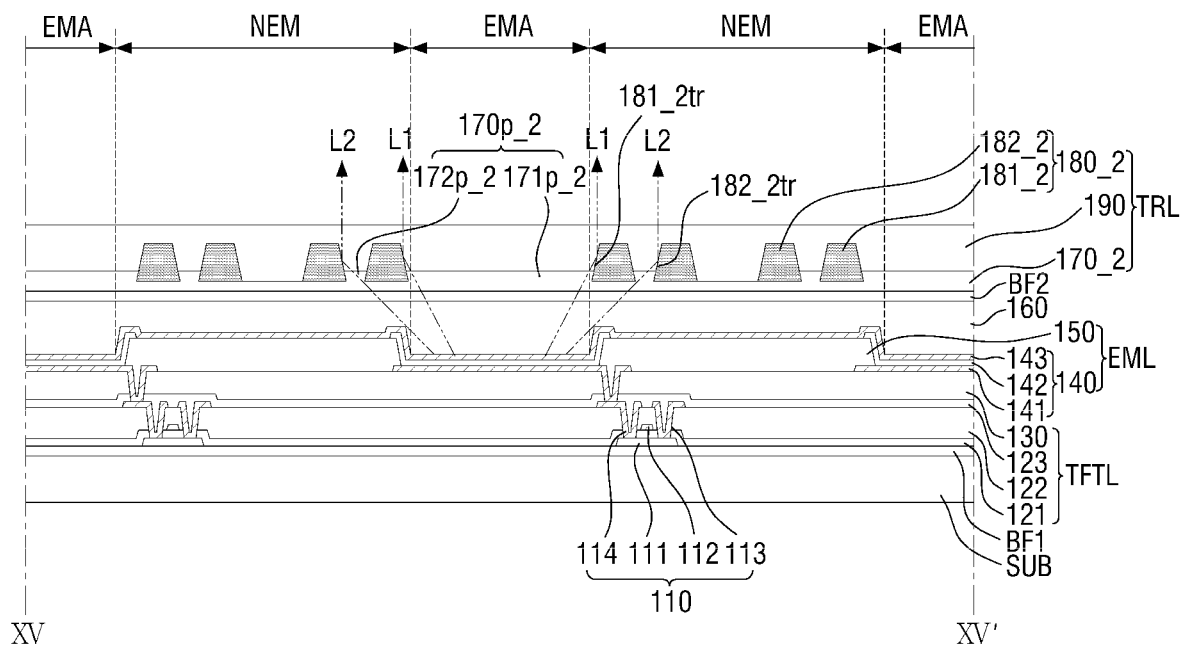
FIG. 15 is a cross-sectional view illustrating an example of a cross section taken along the line XV-XV' of FIG. 13.
Figure 16:
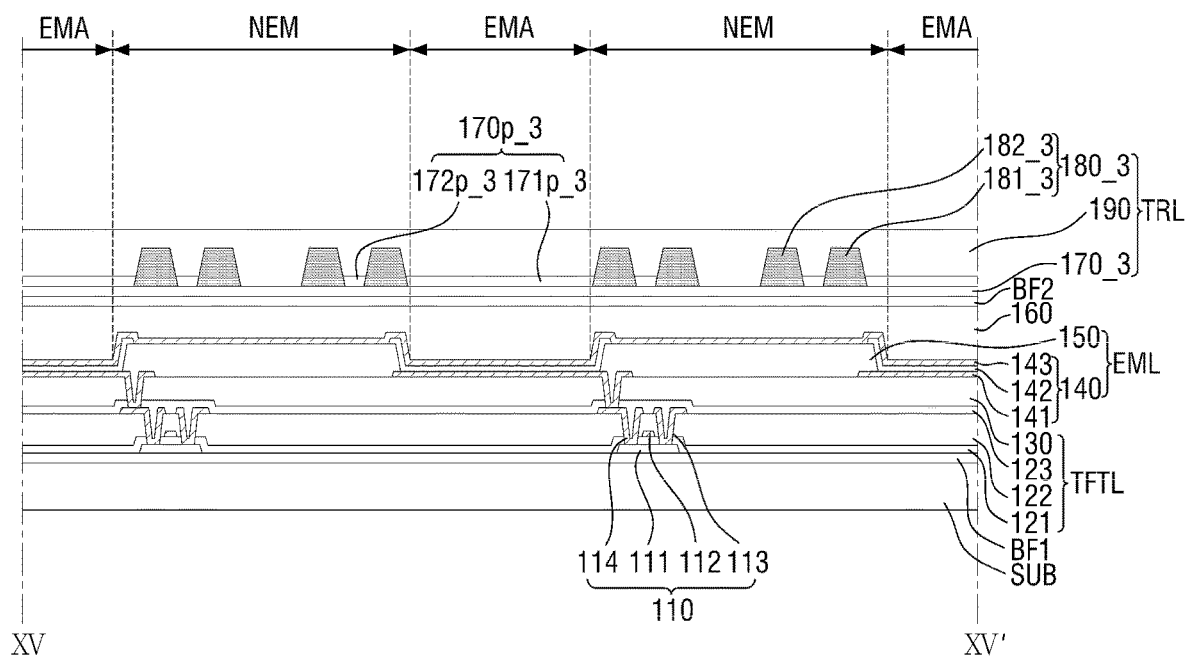
FIG. 16 is a cross-sectional view illustrating another example of a cross section taken along the line XV-XV' of FIG. 13.

FIG. 13 is an enlarged plan view illustrating another example of the area Q1 of FIG. 2. FIG. 14 is an enlarged plan view illustrating another example of the area Q1 of FIG. 2. FIG. 15 is a cross-sectional view illustrating an example of a cross section taken along the line XV-XV' of FIG. 13. FIG. 16 is a cross-sectional view illustrating another example of a cross section taken along the line XV-XV' of FIG. 13.

Referring to FIGS. 13 to 16, a display area DA includes a plurality of pixels P, and each pixel includes a light-emitting area EMA. A non-light-emitting area NEM is disposed between the light-emitting areas EMA of the respective pixels.

The display area DA may further include a total reflection layer TRL (e.g., see FIG. 15) surrounding (e.g., around a periphery of) each of the light-emitting areas EMA to improve the efficiency of light output to the outside. In more detail, the total reflection layer TRL may include an inorganic layer 170_2, the low refractive organic layer 180_2, and the high refractive organic layer 190, and may reflect light traveling toward the outside from among the light emitted from the light-emitting area EMA to travel upward.

The low refractive organic layer 180_2 may include the first low refractive organic layer 181_2 and the second low refractive organic layer 182_2. The first low refractive organic layer 181_2 and the second low refractive organic layer 182_2 may be disposed to surround (e.g., around a periphery of) the light-emitting area EMA in a plan view (e.g., in a view from a direction that is perpendicular to or substantially perpendicular to a top surface of the relevant element or layer, for example, such as the top surface of the display panel 100), and the first low refractive organic layer 181_2 may be disposed at (e.g., in or on) an inner side of the second low refractive organic layer 182_2. The first low refractive organic layer 181_2 and the second low refractive organic layer 182_2 may be disposed to be physically spaced apart from each other. Each second low refractive organic layer 182_2 may be disposed to correspond to each light-emitting area EMA as shown in FIG. 13, but the present disclosure is not limited thereto.

As another example, as shown in FIG. 14, a low refractive organic layer 180_2' may include the first low refractive organic layer 181_2 and a second low refractive organic layer 182_2', and the second low refractive organic layer 182_2' may extend and may be formed entirely at (e.g., in or on) the non-light-emitting area NEM. In the low refractive organic layer 180_2', an opening is formed in an area corresponding to each light-emitting area EMA to expose each of the subpixels R, G, and B.

The total reflection layer TRL may be disposed on the thin-film sealing layer 160. The total reflection layer TRL includes the inorganic layer 170_2, the low refractive organic layer 180_2, and the high refractive organic layer 190. The low refractive organic layer 180_2 and the high refractive organic layer 190 are disposed on the inorganic layer 170_2.

The inorganic layer 170_2 may include a base part disposed on the thin-film sealing layer 160, and a protruding pattern part 170p_2 protruding from the base part in the thickness direction. The protruding pattern part 170p_2 may include a first protruding pattern part 171p_2 and a second protruding pattern part 172p_2.

The low refractive organic layer 180_2 may include the first low refractive organic layer 181_2 and the second low refractive organic layer 182_2.

The inorganic layer 170_2 may be formed entirely on the second buffer film BF2 to cover the thin-film sealing layer 160.

The protruding pattern part 170p_2 may be a supporting layer for securing a process stability during the formation of the low refractive organic layer 180_2. In more detail, the protruding pattern part 170p_2 may support the low refractive organic layer 180_2, so that the shape of the low refractive organic layer 180_2 does not collapse during a photolithography process when the low refractive organic layer 180_2 is formed. The first protruding pattern part 171p_2 may support a total reflection surface 181_2tr of the first low refractive organic layer 181_2, and the second protruding pattern part 172p_2 may support a total reflection surface 182_2tr of the second low refractive organic layer 182_2.

Opposite cross-sectional lateral surfaces of the protruding pattern part 170p_2 may each have a reverse tapered shape or substantially a reverse tapered shape, and thus, at least a portion of the total reflection surface of the low refractive organic layer 180_2 may be supported to have an inclined surface. The cross-sectional shape of the protruding pattern part 170p_2 may be a reverse trapezoidal shape, but the present disclosure is not limited thereto, and the cross-sectional shape thereof may be a triangular shape, one of various suitable polygonal shapes, or a shape having a curved surface. The shape of the low refractive organic layer 180_2 disposed on the protruding pattern part 170p_2 may be variously modified according to the cross-sectional shape of the protruding pattern part 170p_2.

The first protruding pattern part 171p_2 may be disposed on an inner side of the first low refractive organic layer 181_2, and may overlap with the light-emitting area EMA in a direction that is perpendicular to or substantially perpendicular to the substrate SUB. A width of the first protruding pattern part 171p_2 may be equal to or greater than a width of the light-emitting area EMA. In some embodiments, at least a portion of the first protruding pattern part 171p_2 may overlap with the non-light-emitting area NEM.

The second protruding pattern part 172p_2 may be disposed between the first low refractive organic layer 181_2 and the second low refractive organic layer 182_2, and may be disposed at (e.g., in or on) the non-light-emitting area NEM.

In some embodiments, the inorganic layer 170_2 may further include a third protruding pattern part, which may be disposed between the second low refractive organic layers 182_2, and may be disposed entirely at (e.g., in or on) the non-light-emitting area NEM.

The first protruding pattern part 171p_2 and the second protruding pattern part 172p_2 may each be formed to have a thickness of 1000 Å to 5000 Å from an upper surface of the inorganic layer 170_2, but the present disclosure is not limited thereto, and the first protruding pattern part 171p_2 and the second protruding pattern part 172p_2 may each have a greater thickness. In addition, the first protruding pattern part 171p_2 and the second protruding pattern part 172p_2 may have the same or substantially the same thickness as each other in an embodiment, but the present disclosure is not limited thereto, and the first protruding pattern part 171p_2 and the second protruding pattern part 172p_2 may have different thicknesses from each other in another embodiment.

FIG. 16 shows an example of a protruding pattern part 170p_3 that is formed as a separate layer from that of an inorganic layer 170_3 on the inorganic layer 170_3. The protruding pattern part 170p_3 includes a first protruding pattern part 171p_3 and a second protruding pattern part 172p_3. In FIG. 16, both the first protruding pattern part 171p_3 and the second protruding pattern part 172p_3 are illustrated as being formed as a separate layer from that of the inorganic layer 170_3, but the present disclosure is not limited thereto. In other words, one of the first protruding pattern part 171p_3 or the second protruding pattern part 172p_3 may be formed as a separate layer from that of the inorganic layer 170_3, and the other one thereof may be formed to extend from the inorganic layer 170_3.

When the protruding pattern part 170p_3 is formed as a separate layer from that of the inorganic layer 170_3, the inorganic layer 170_3 may be disposed to have a uniform or an approximately uniform thickness along a surface of the second buffer film BF2. The protruding pattern part 170p_3 may be formed of a material that is different from that of the inorganic layer 170_3, and the thickness of the protruding pattern part 170p_3 may be freely adjusted. Accordingly, the shape of a low refractive organic layer 180_3 that is disposed on the inorganic layer 170_3 and the protruding pattern part 170p_3 may be more variously designed.

Referring to FIG. 15 again, the high refractive organic layer 190 and the low refractive organic layer 180_2 may be disposed on the inorganic layer 170_2. The low refractive organic layer 180_2 may include the first low refractive organic layer 181_2 and the second low refractive organic layer 182_2.

The low refractive organic layer 180_2 may be disposed to be adjacent to the light-emitting area EMA, and may direct light L1 and L2 upward to the outside, from among the light emitted from the light-emitting area EMA that is incident on the low refractive organic layer 180_2. The low refractive organic layer 180_2 may have a lower refractive index than those of the inorganic layer 170_2 and the high refractive organic layer 190.

When the low refractive organic layer 180_2 is formed on the inorganic layer 170_2, the total reflection surfaces 181_2tr and 182_2tr of the low refractive organic layer 180_2, which meets (e.g., which contacts) the protruding pattern part 170p_2, may have a suitable slope (e.g., a predetermined slope) with respect to the inorganic layer 170_2. In more detail, the first low refractive organic layer 181_2 may include the first total reflection surface 181_2tr having a slope, and the second low refractive organic layer 182_2 may include a second total reflection surface 182_2tr having a slope.

In an embodiment, the slope formed between a bottom surface of the first low refractive organic layer 181_2 and the total reflection surface 181_2tr of the first low refractive organic layer 181_2 may have an angle of 60° to 85°, and the slope formed between a bottom surface of the second low refractive organic layer 182_2 and the total reflection surface 182_2tr of the second low refractive organic layer 182_2 may be smaller than or equal to the slope formed between the bottom surface of the first low refractive organic layer 181_2 and the total reflection surface 181_2tr of the first low refractive organic layer 181_2.

As described above, the total reflection surfaces 181_2tr and 182_2tr of the low refractive organic layer 180_2 may be inclined surfaces, and thus, a cross-sectional shape of the low refractive organic layer 180_2 may have a tapered surface.

Unlike the embodiments described with reference to FIGS. 5 to 8, the present embodiments include the first low refractive organic layer 181_2 and the second low refractive organic layer 182_2, and thus, may output more light to the outside. For example, the low refractive organic layer 180_2 includes the first total reflection surface 181_2tr and the second total reflection surface 182_2tr, and thus, may effectively output (e.g., direct) light upward by reflecting light more than those of the above-described embodiments.

The high refractive organic layer 190 may be disposed on the inorganic layer 170_2 and the low refractive organic layer 180_2. The high refractive organic layer 190 may be formed to entirely cover the inorganic layer 170_2 and the low refractive organic layer 180_2, and thus, may planarize or substantially planarize (e.g., may generally planarize) the total reflection layer TRL disposed on the thin-film sealing layer 160.

The high refractive organic layer 190 may be formed to have a thickness of 5 μm or more from the upper surface of the inorganic layer 170_2. In other words, the high refractive organic layer 190 may be formed to be thicker than the low refractive organic layer 180_2.

The embodiments illustrated in FIGS. 17 to 22 may be different from the embodiments described above with reference to FIGS. 5 to 16, in that a touch sensor layer TSL may be further disposed on the thin-film sealing layer 160. Hereinafter, the differences from the embodiments described with reference to FIGS. 5 to 16 will be mainly described in more detail, and redundant description therebetween may not be repeated.

Figure 17:
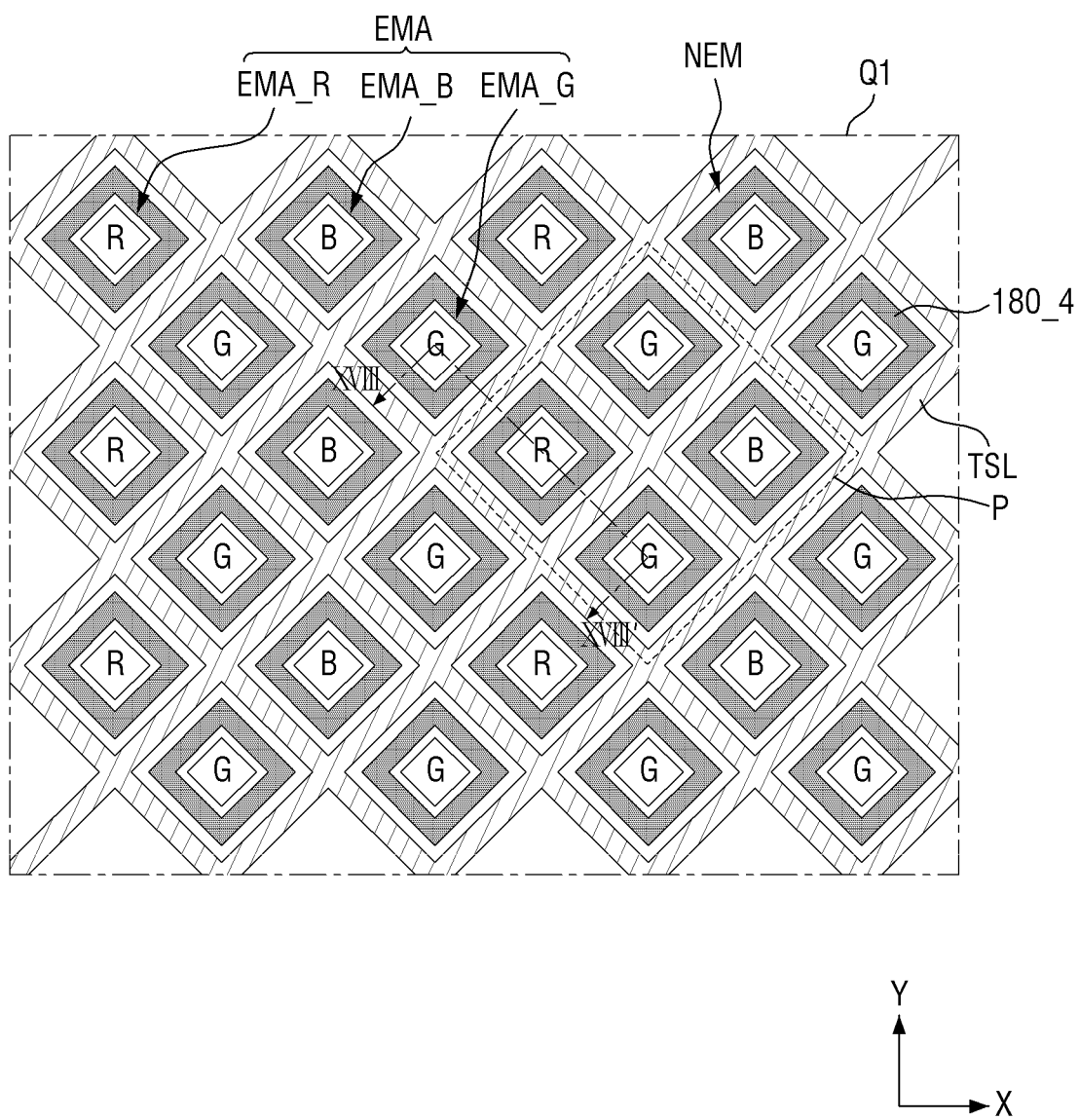
FIG. 17 is an enlarged plan view illustrating another example of the area Q1 of FIG. 2.
Figure 18:
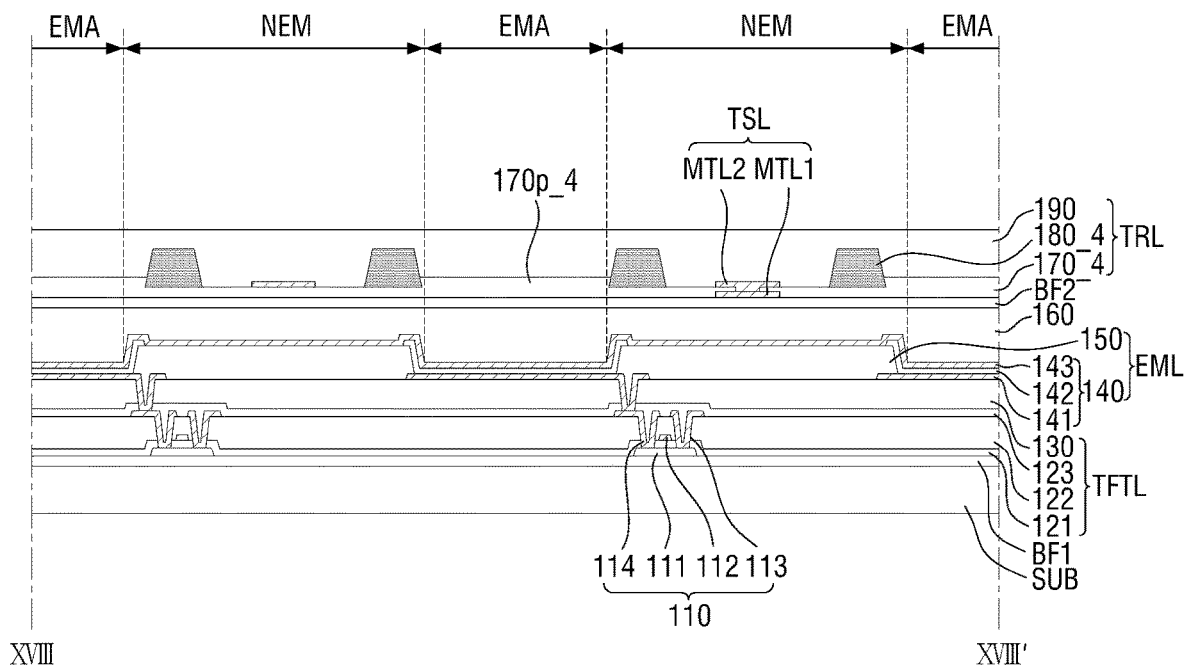
FIG. 18 is a cross-sectional view illustrating an example of a cross section taken along the line XVIII-XVIII' of FIG. 17.
Figure 19:
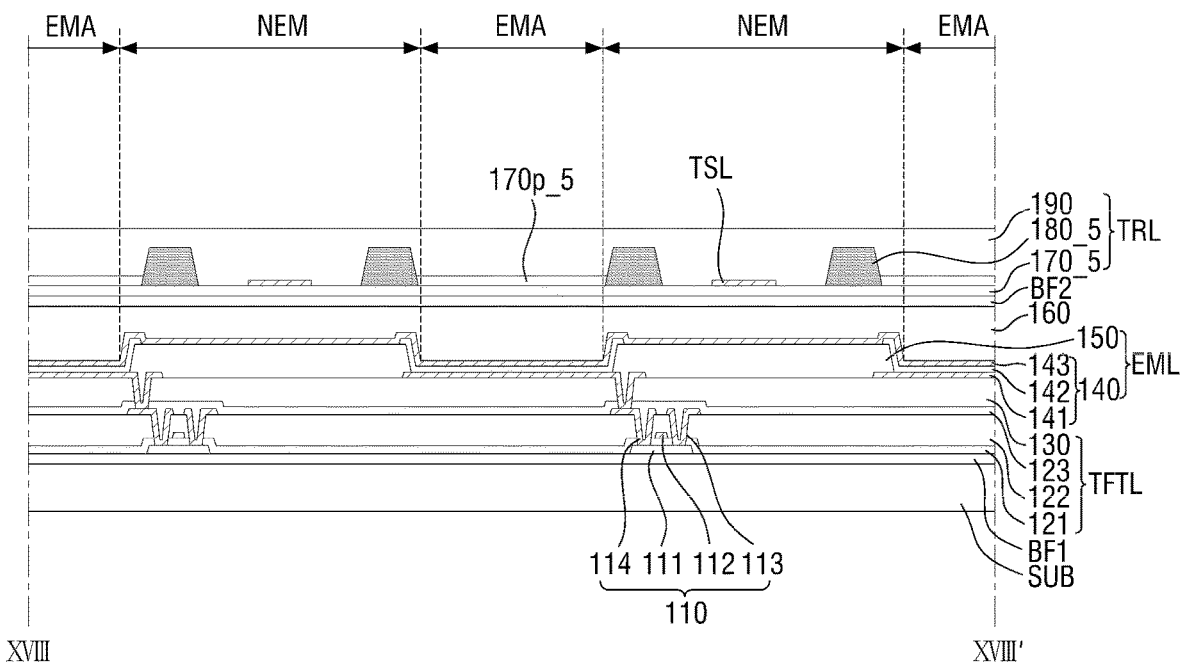
FIG. 19 is a cross-sectional view illustrating another example of a cross section taken along the line XVIII-XVIII' of FIG. 17.

FIG. 17 is an enlarged plan view illustrating another example of the area Q1 of FIG. 2. FIG. 18 is a cross-sectional view illustrating an example of a cross section taken along the line XVIII-XVIII' of FIG. 17. FIG. 19 is a cross-sectional view illustrating another example of a cross section taken along the line XVIII-XVIII' of FIG. 17.

A display area DA may further include a total reflection layer TRL (e.g., see FIG. 18) surrounding (e.g., around a periphery of) each light-emitting area EMA to improve the efficiency of light output to the outside. In more detail, the total reflection layer TRL may include an inorganic layer 170_4, a low refractive organic layer 180_4, and the high refractive organic layer 190, and may reflect light traveling toward the outside from among the light emitted from the light-emitting area EMA to travel upward.

In addition, the display area DA may further include a touch sensor layer TSL for sensing a user's touch in a capacitance manner. For example, the touch sensor layer TSL may sense the user's touch in a self-capacitance manner or a mutual capacitance manner. The touch sensor layer TSL may sense the user's touch, and may transmit a touch signal to the touch driving circuit 400 (e.g., see FIG. 1).

The touch sensor layer TSL may be formed of mesh-shaped electrodes, and may be disposed at (e.g., in or on) the non-light-emitting area NEM along a boundary of each subpixel R, G, and B. The touch sensor layer TSL may not overlap with the light-emitting areas EMA. A width of the touch sensor layer TSL may be less than a width of the non-light-emitting area NEM. In an embodiment, an area exposed by the touch sensor layer TSL may have a rhombus or substantially rhombus shape (e.g., in a plan view). A size of each of the areas exposed by touch sensor layer TSL may be the same or substantially the same as each other, but may be different from each other depending on the size of the light-emitting area EMA that is exposed by the corresponding area, and may be different from each other regardless of the size of the light-emitting area EMA that is exposed by the corresponding area. One area exposed by the touch sensor layer TSL is illustrated in the drawings as corresponding to one light-emitting area EMA, but the present disclosure is not limited thereto, and one area exposed by the touch sensor layer TSL may correspond to two or more light-emitting areas EMA.

The touch sensor layer TSL is formed on the thin-film sealing layer 160. The touch sensor layer TSL may include a first metal layer MTL1 disposed on the second buffer film BF2, and a second metal layer MTL2 disposed on the inorganic layer 170_4. The first metal layer MTL1 and the second metal layer MTL2 may be formed of one from among a stacked structure (Ti/Al/Ti) of aluminum and titanium, a stacked structure (ITO/Al/ITO) of aluminum and ITO, a silver-palladium-copper (APC) alloy, and/or a stacked structure (ITO/APC/ITO) of an APC alloy and ITO. In addition, the first metal layer MTL1 and the second metal layer MTL2 may include (e.g., may be made of) the same material as each other, but the present disclosure is not limited thereto.

A contact hole exposing the first metal layer MTL1 by passing through (e.g., by penetrating) the inorganic layer 170_4 may be formed in the inorganic layer 170_4 disposed between the first metal layer MTL1 and the second metal layer MTL2 to electrically connect the first metal layer MTL1 and the second metal layer MTL2 to each other. Although only one metal layer is illustrated as the touch sensor layer TSL in FIGS. 19, 21, and 22, the touch sensor layer TSL may include the first metal layer MTL1 and the second metal layer MTL2, for example, as shown in FIG. 18.

Because the touch sensor layer TSL may be formed directly on the thin-film sealing layer 160, the thickness of the display device may be reduced more than a case in which a separate touch panel including touch electrodes is attached to the thin-film sealing layer 160. In addition, the touch sensor layer TSL may not only be formed of the mesh-shaped electrodes, but may also be disposed to overlap with the bank layer 150. Thus, it may be possible to prevent or substantially prevent a reduction in an opening area of each of the subpixels R, G, and B.

The low refractive organic layer 180_4 may be disposed to surround (e.g., around a periphery of) the light-emitting area EMA in a plan view, and an opening may be formed in an area corresponding to each light-emitting area EMA to expose each of the subpixels R, G, and B.

The total reflection layer TRL may be disposed on the thin-film sealing layer 160. The total reflection layer TRL includes the inorganic layer 170_4, and the low refractive organic layer 180_4 and the high refractive organic layer 190 that are disposed on the inorganic layer 170_4. The inorganic layer 170_4 may include a base part disposed on the thin-film sealing layer 160, and a protruding pattern part 170p_4 protruding from the base part in the thickness direction.

The inorganic layer 170_4 may be formed entirely on the second buffer film BF2 to cover the thin-film sealing layer 160. The protruding pattern part 170p_4 may be a supporting layer for securing a process stability during the formation of the low refractive organic layer 180_4.

Opposite cross-sectional lateral surfaces of the protruding pattern part 170p_4 may each have a reversed tapered shape or substantially a reverse tapered shape, and thus, at least a portion of a total reflection surface of the low refractive organic layer 180_4 may be supported to have an inclined surface. The cross-sectional shape of the protruding pattern part 170p_4 may be a reverse trapezoidal shape, but is not limited thereto, and may be a triangular shape, one of various suitable polygonal shapes, or a shape having a curved surface. The shape of the low refractive organic layer 180_4 disposed on the protruding pattern part 170p_4 may be variously modified according to the cross-sectional shape of the protruding pattern part 170p_4.

The protruding pattern part 170p_4 may overlap with the light-emitting area EMA in a direction that is perpendicular to or substantially perpendicular to the substrate SUB. A width of the protruding pattern part 170p_4 may be equal to or greater than a width of the light-emitting area EMA. In some embodiments, at least a portion of the protruding pattern part 170*p*_4 may overlap with the non-light-emitting area NEM.

In some embodiments, the inorganic layer 170_4 may further include a protruding pattern part, which is disposed between the low refractive organic layers 180_4, and disposed entirely at (e.g., in or on) the non-light-emitting area NEM. In this case, the second metal layer of the touch sensor layer TSL may be disposed on the protruding pattern part 170*p*_4.

FIG. 19 shows an example of a structure in which a protruding pattern part 170*p*_5 is formed as a separate layer from that of an inorganic layer 170_5 on the inorganic layer 170_5. When the protruding pattern part 170*p*_5 is formed as a separate layer from that of the inorganic layer 170_5, the inorganic layer 170_5 may be disposed to have a uniform or an approximately uniform thickness along a surface of the second buffer film BF2. In addition, the thickness of the protruding pattern part 170*p*_5 may be freely adjusted, and the protruding pattern part 170*p*_5 may be made of a material that is different from that of the inorganic layer 170_5. Accordingly, the shape of a low refractive organic layer 180_5 disposed on the inorganic layer 170_5 and the protruding pattern part 170*p*_5 may be more variously designed.

Referring to FIG. 18 again, the high refractive organic layer 190 and the low refractive organic layer 180_4 may be disposed on the inorganic layer 170_4. The low refractive organic layer 180_4 may have a lower refractive index than those of the above-described inorganic layer 170_4 and the high refractive organic layer 190.

When the low refractive organic layer 180_4 is formed on the inorganic layer 170_4, at least a portion of the total reflection surface of the low refractive organic layer 180_4, which meets (e.g., which contacts) the protruding pattern part 170*p*_4, may have a suitable slope (e.g., a predetermined slope) with respect to the inorganic layer 170_4.

The high refractive organic layer 190 may be disposed on the inorganic layer 170_4, the touch sensor layer TSL, and the low refractive organic layer 180_4. The high refractive organic layer 190 may be formed to entirely cover the inorganic layer 170_4, the touch sensor layer TSL, and the low refractive organic layer 180_4, and thus, may planarize or substantially planarize (e.g., may generally planarize) the total reflection layer TRL disposed on the thin-film sealing layer 160, and may cover and protect the touch sensor layer TSL.

Figure 20:
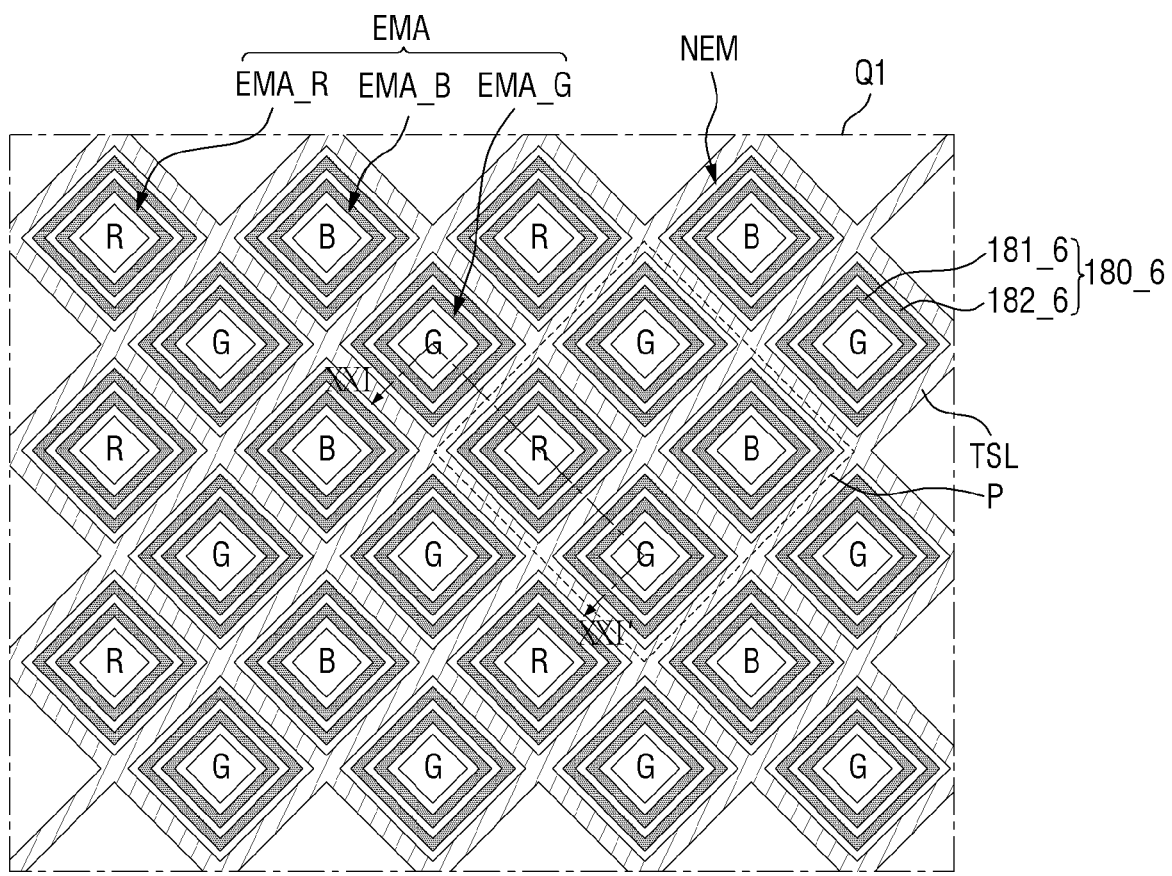
FIG. 20 is an enlarged plan view illustrating another example of the area Q1 of FIG. 2.
Figure 21:
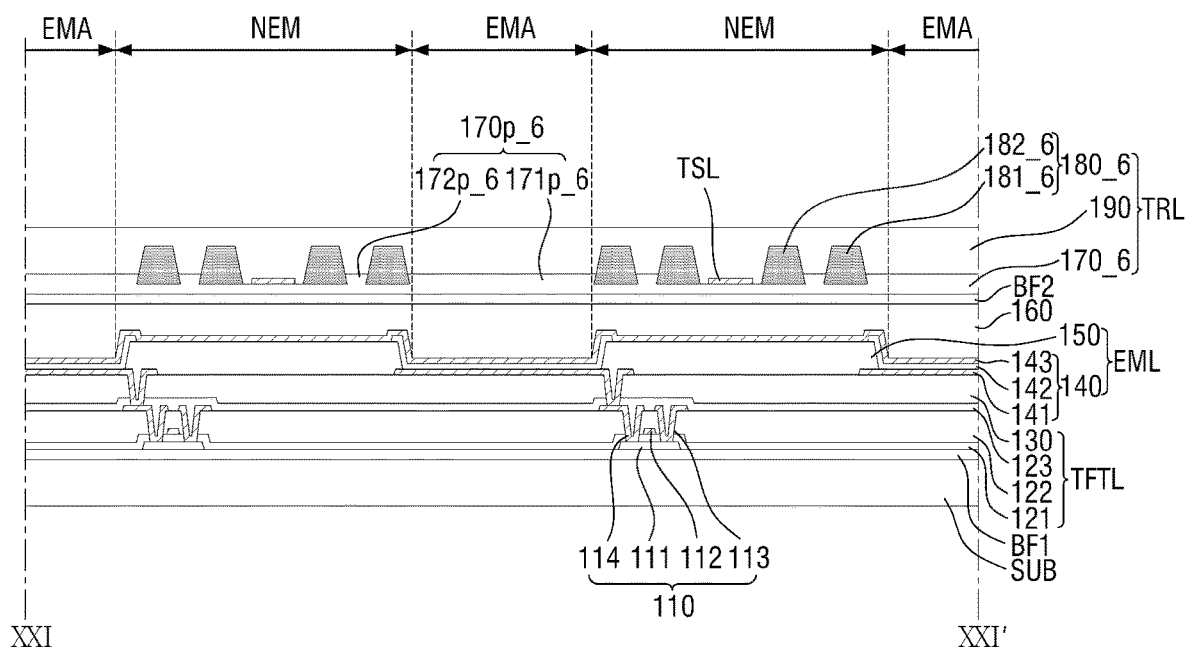
FIG. 21 is a cross-sectional view illustrating an example of a cross section taken along the line XXI-XXI' of FIG. 20.
Figure 22:
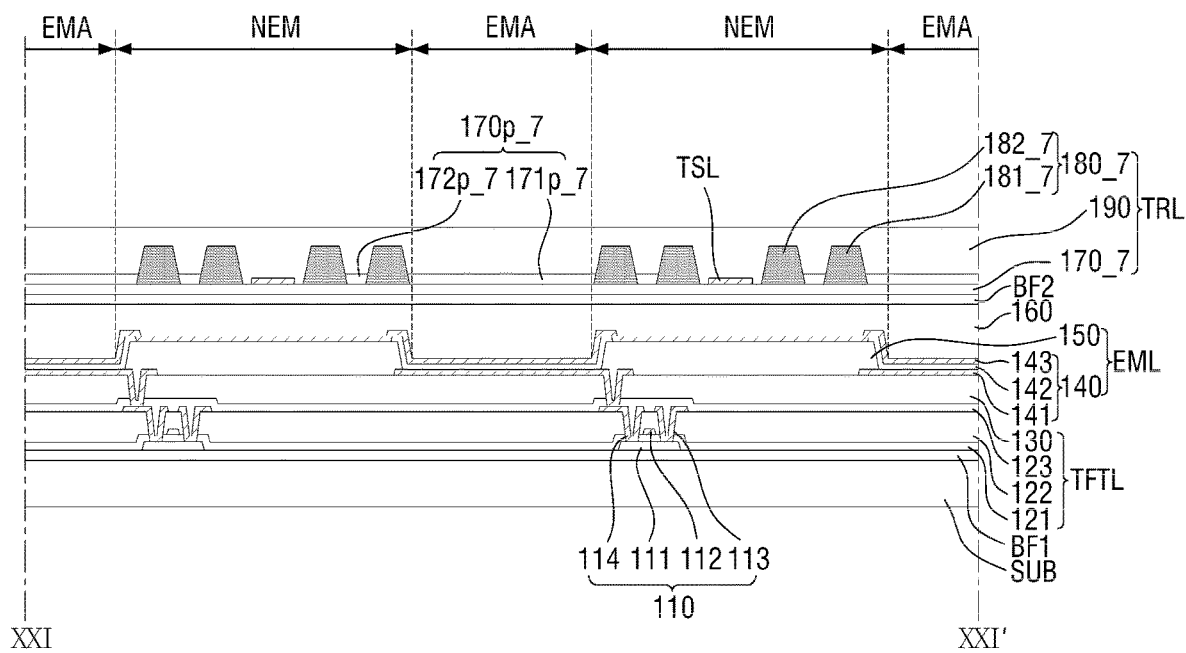
FIG. 22 is a cross-sectional view illustrating another example of a cross section taken along the line XXI-XXI' of FIG. 20.

The embodiments of FIGS. 20 to 22 may be different from the above-described embodiments of FIGS. 17 to 19, in that a low refractive organic layer 180_6 includes a first low refractive organic layer 181_6 and a second low refractive organic layer 182_6. Hereinafter, the differences from the embodiments described with reference to FIGS. 17 to 19 may be mainly described in more detail, and redundant description therebetween may not be repeated.

FIG. 20 is an enlarged plan view illustrating another example of the area Q1 of FIG. 2. FIG. 21 is a cross-sectional view illustrating an example of a cross section taken along the line XXI-XXI' of FIG. 20. FIG. 22 is a cross-sectional view illustrating another example of a cross section taken along the line XXI-XXI' of FIG. 20.

A display area DA may further include a total reflection layer TRL (e.g., see FIG. 21) surrounding (e.g., around a periphery of) each light-emitting area EMA to improve the efficiency of light output to the outside. In more detail, the total reflection layer TRL may include an inorganic layer 170_6, the low refractive organic layer 180_6, and the high refractive organic layer 190, and may reflect light traveling toward the outside from among the light emitted from the light-emitting area EMA to travel upward.

The low refractive organic layer 180_6 may include the first low refractive organic layer 181_6 and the second low refractive organic layer 182_6. The first low refractive organic layer 181_6 and the second low refractive organic layer 182_6 may be disposed to surround (e.g., around a periphery of) the light-emitting area EMA in a plan view, and the first low refractive organic layer 181_6 may be disposed at (e.g., in or on) an inner side of the second low refractive organic layer 182_6. The first low refractive organic layer 181_6 and the second low refractive organic layer 182_6 may be disposed to be physically spaced apart from each other. Each second low refractive organic layer 182_6 may be disposed to correspond to each light-emitting area EMA as shown in FIG. 20, but the present disclosure is not limited thereto.

The total reflection layer TRL may be disposed on the thin-film sealing layer 160. The total reflection layer TRL includes the inorganic layer 170_6, and the low refractive organic layer 180_6 and the high refractive organic layer 190 that are disposed on the inorganic layer 170_6.

The low refractive organic layer 180_6 may include the first low refractive organic layer 181_6 and the second low refractive organic layer 182_6.

The inorganic layer 170_6 may include a base part disposed on the thin-film sealing layer 160, and a protruding pattern part 170*p*_6 protruding from the base part in the thickness direction. In addition, the protruding pattern part 170*p*_6 may include a first protruding pattern part 171*p*_6 and a second protruding pattern part 172*p*_6.

The inorganic layer 170_6 may be formed entirely on the second buffer film BF2 to cover the thin-film sealing layer 160.

The protruding pattern part 170*p*_6 may be a supporting layer for securing a process stability during the formation of the low refractive organic layer 180_6. The first protruding pattern part 171*p*_6 may support a total reflection surface 181_6*tr* of the first low refractive organic layer 181_6, and the second protruding pattern part 172*p*_6 may support a total reflection surface 182_6*tr* of the second low refractive organic layer 182_6.

The first protruding pattern part 171*p*_6 may be disposed on an inner side of the first low refractive organic layer 181_6, and may overlap with the light-emitting area EMA in a direction that is perpendicular to or substantially perpendicular to the substrate SUB. A width of the first protruding pattern part 171*p*_6 may be equal to or greater than a width of the light-emitting area EMA. In some embodiments, at least a portion of the first protruding pattern part 171*p*_6 may overlap with the non-light-emitting area NEM.

The second protruding pattern part 172*p*_6 may be disposed between the first low refractive organic layer 181_6 and the second low refractive organic layer 182_6, and may be disposed at (e.g., in or on) the non-light-emitting area NEM.

The first protruding pattern part 171*p*_6 and the second protruding pattern part 172*p*_6 may each be formed to have a thickness of 1000 Å to 5000 Å from an upper surface of the inorganic layer 170_6, but the present disclosure is not limited thereto, and the first protruding pattern part 171*p*_6 and the second protruding pattern part 172*p*_6 may have a greater thickness. In addition, the first protruding pattern part 171*p*_6 and the second protruding pattern part 172*p*_6 may have the same or substantially the same thickness as each other in an embodiment, but may have different thicknesses from each other in another embodiment.

FIG. 22 shows an example of a structure in which a protruding pattern part 170p_7 is formed as a separate layer from that of an inorganic layer 170_7 on the inorganic layer 170_7. The protruding pattern part 170p_7 may include a first protruding pattern part 171p_7 and a second protruding pattern part 172p_7. In FIG. 22, both the first protruding pattern part 171p_7 and the second protruding pattern part 172p_7 are illustrated as being formed as a separate layer from that of the inorganic layer 170_7, but the present disclosure is not limited thereto. In other words, one of the first protruding pattern part 171p_7 or the second protruding pattern part 172p_7 may be formed as a separate layer from that of the inorganic layer 170_7, and the other one thereof may be formed to extend from the inorganic layer 170_7. When the protruding pattern part 170p_7 is formed as a separate layer from that of the inorganic layer 170_7, the inorganic layer 170_7 may be disposed to have a uniform or an approximately uniform thickness along a surface of the second buffer film BF2.

Referring to FIG. 21 again, the high refractive organic layer 190 and the low refractive organic layer 180_6 may be disposed on the inorganic layer 170_6. The low refractive organic layer 180_6 may include the first low refractive organic layer 181_6 and the second low refractive organic layer 182_6.

The low refractive organic layer 180_6 may be disposed to be adjacent to the light-emitting area EMA, and may direct light upward to the outside, from among the light emitted from the light-emitting area EMA that is incident on the low refractive organic layer 180_6. The low refractive organic layer 180_6 may have a lower refractive index than those of the above-described inorganic layer 170_6 and the high refractive organic layer 190.

When the low refractive organic layer 180_6 is formed on the inorganic layer 170_6, at least a portion of the total reflection surface of the low refractive organic layer 180_6, which meets (e.g., which contacts) the protruding pattern part 170p_6, may have a suitable slope (e.g., a predetermined slope) with respect to the inorganic layer 170_6. Accordingly, a cross section of the low refractive organic layer 180_6 may have a tapered surface.

In an embodiment, a slope formed between a bottom surface of the first low refractive organic layer 181_6 and the total reflection surface of the first low refractive organic layer 181_6 may have an angle of 60° to 85°, and a slope formed between a bottom surface of the second low refractive organic layer 182_6 and the total reflection surface of the second low refractive organic layer 182_6 may be smaller than or equal to the slope formed between the bottom surface of the first low refractive organic layer 181_6 and the total reflection surface of the first low refractive organic layer 181_6.

Unlike the embodiments described above with reference to FIGS. 17 to 19, the present embodiments include the first low refractive organic layer 181_6 and the second low refractive organic layer 182_6, and thus, may output more light to the outside. For example, the low refractive organic layer 180_6 includes the total reflection surface of the first low refractive organic layer 181_6 and the total reflection surface of the second low refractive organic layer 182_6, and thus, may output more light upward as compared with the above-described embodiments.

The high refractive organic layer 190 may be disposed on the inorganic layer 170_6 and the low refractive organic layer 180_6. The high refractive organic layer 190 may be formed to entirely cover the inorganic layer 170_6 and the low refractive organic layer 180_6, and thus, may planarize or substantially planarize (e.g., may generally planarize) the total reflection layer TRL disposed on the thin-film sealing layer 160. The high refractive organic layer 190 may be formed to have a thickness of 5 μm or more from the upper surface of the inorganic layer 170_6. In other words, the high refractive organic layer 190 may be formed to be thicker than the low refractive organic layer 180_6.

Figure 23:
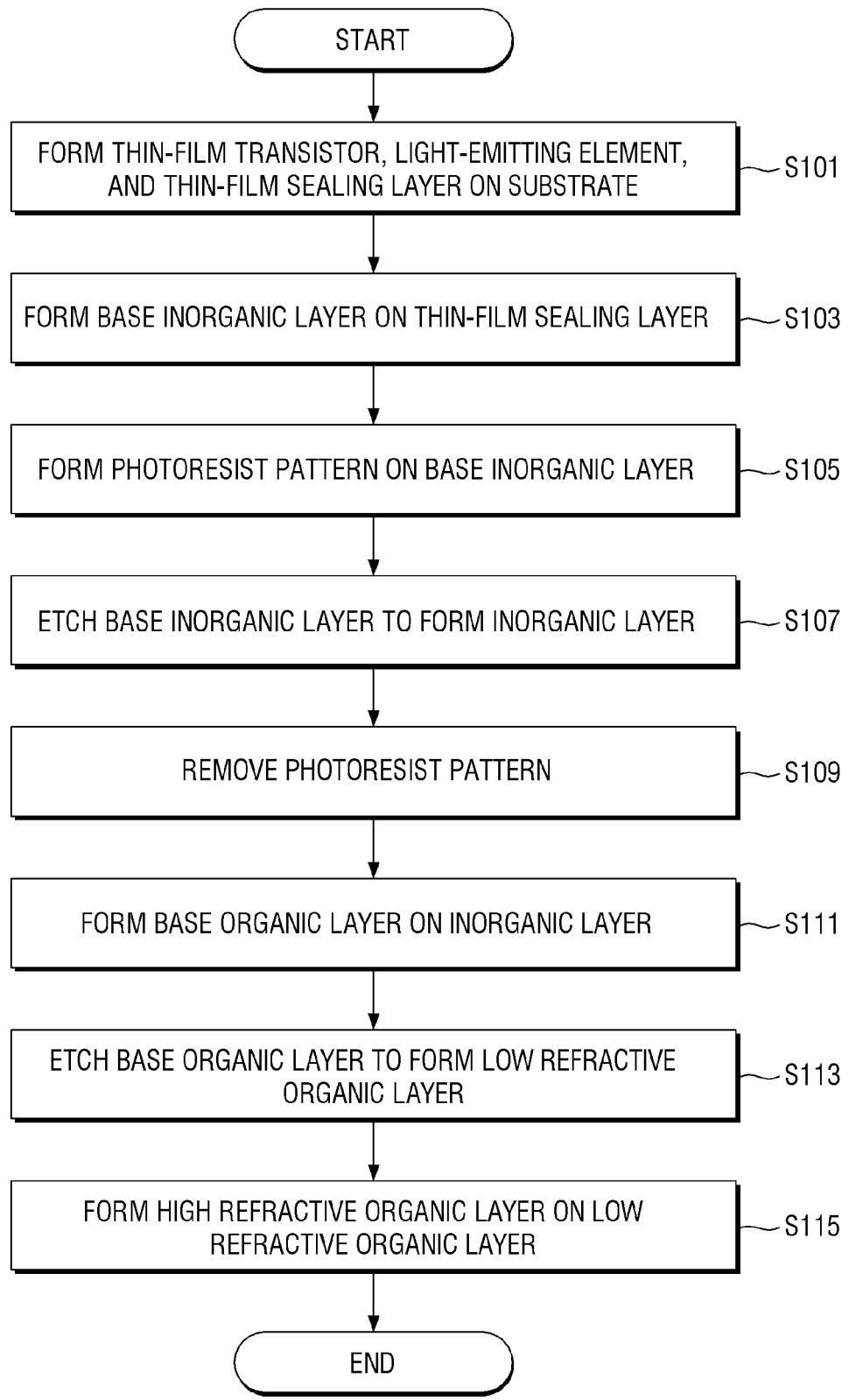
FIG. 23 is a flowchart illustrating a method of manufacturing the display device according to an embodiment.
Figure 24:
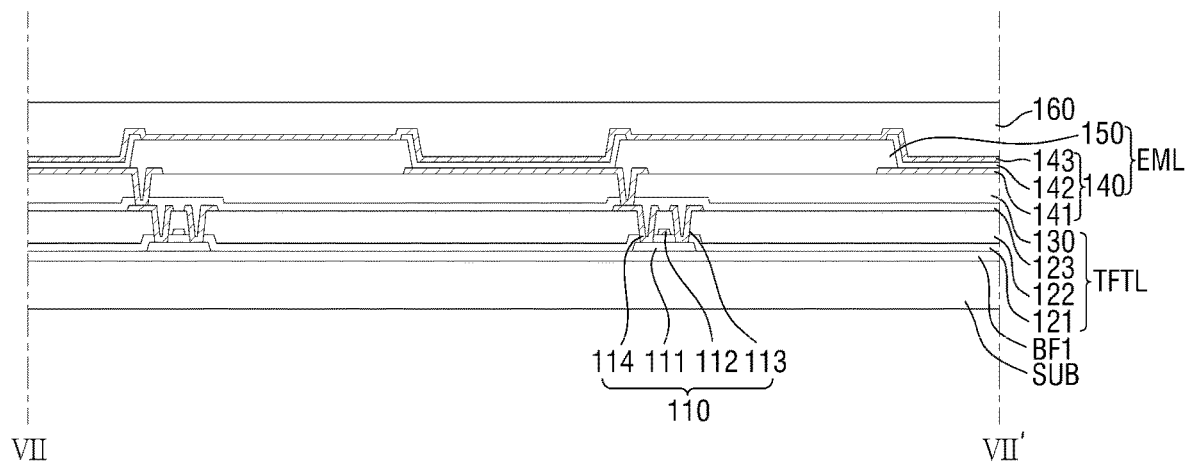
FIGS. 24-31 are cross-sectional views taken along the line VII-VII' of FIG. 5, and sequentially illustrate various processes of the method of manufacturing the display device according to an embodiment.
Figure 25:
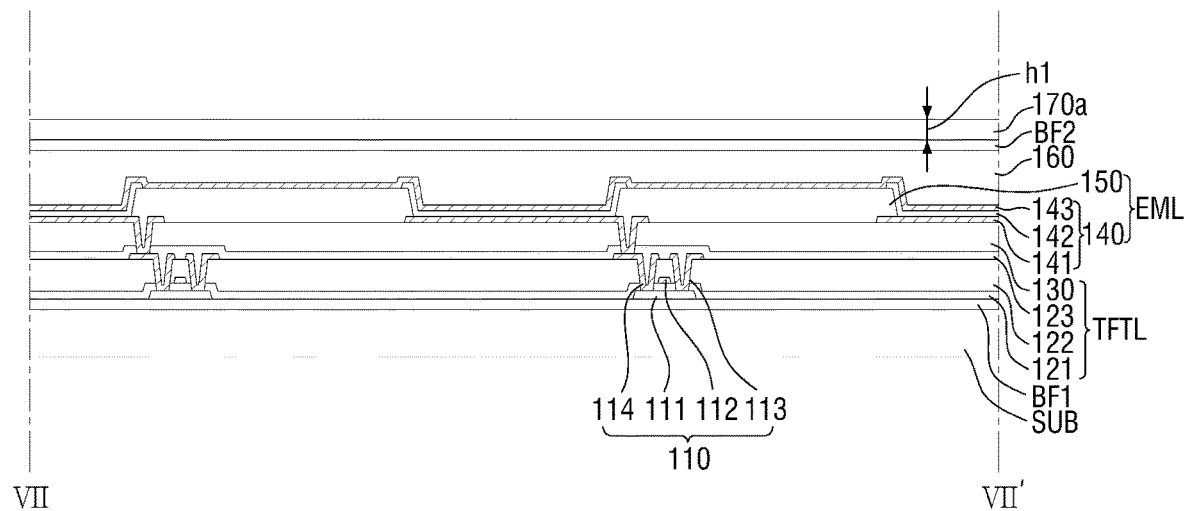
Figure 26:
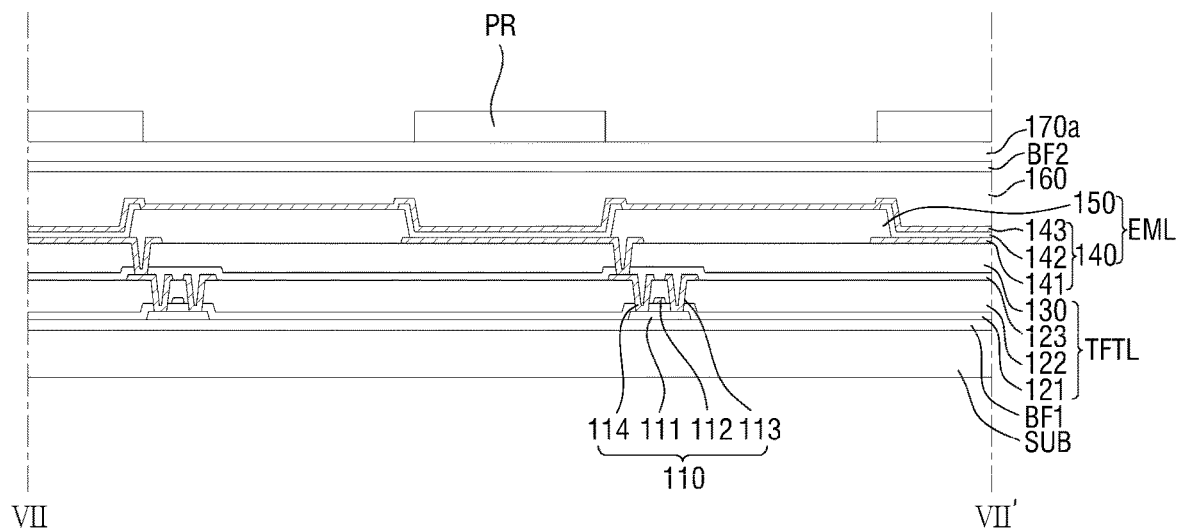
Figure 27:
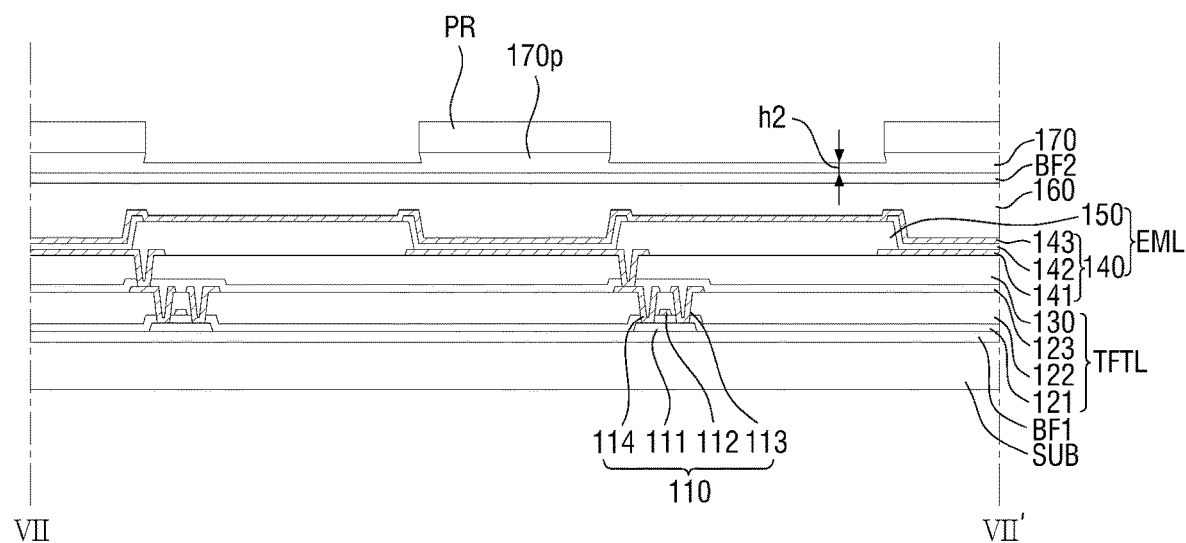
Figure 28:
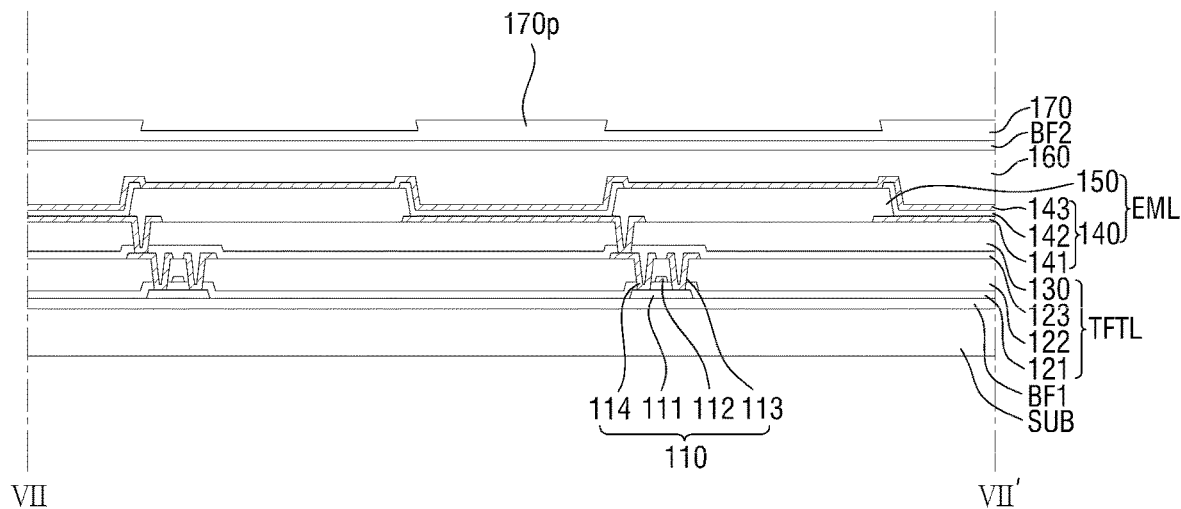
Figure 29:
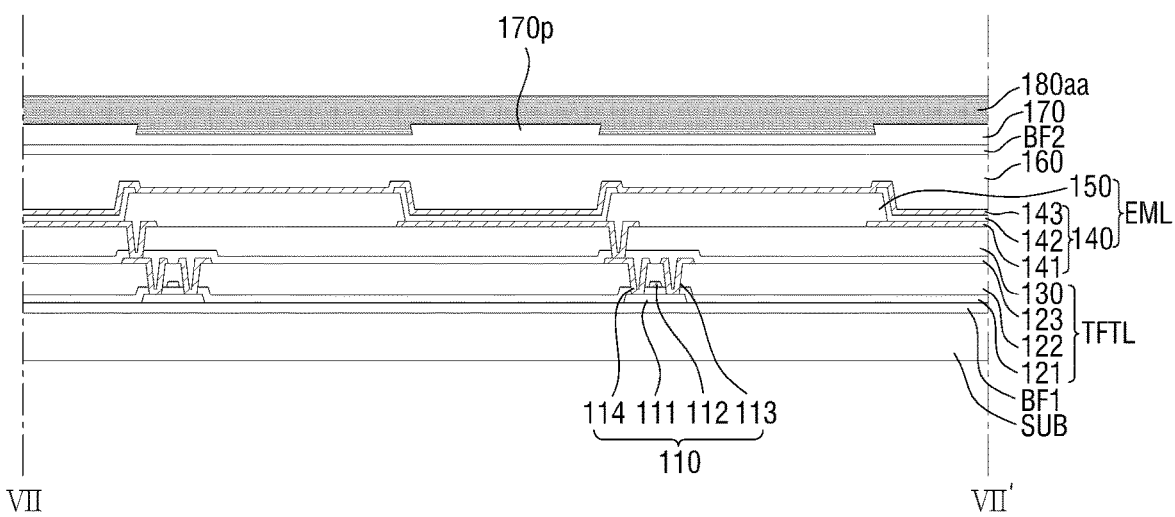
Figure 30:
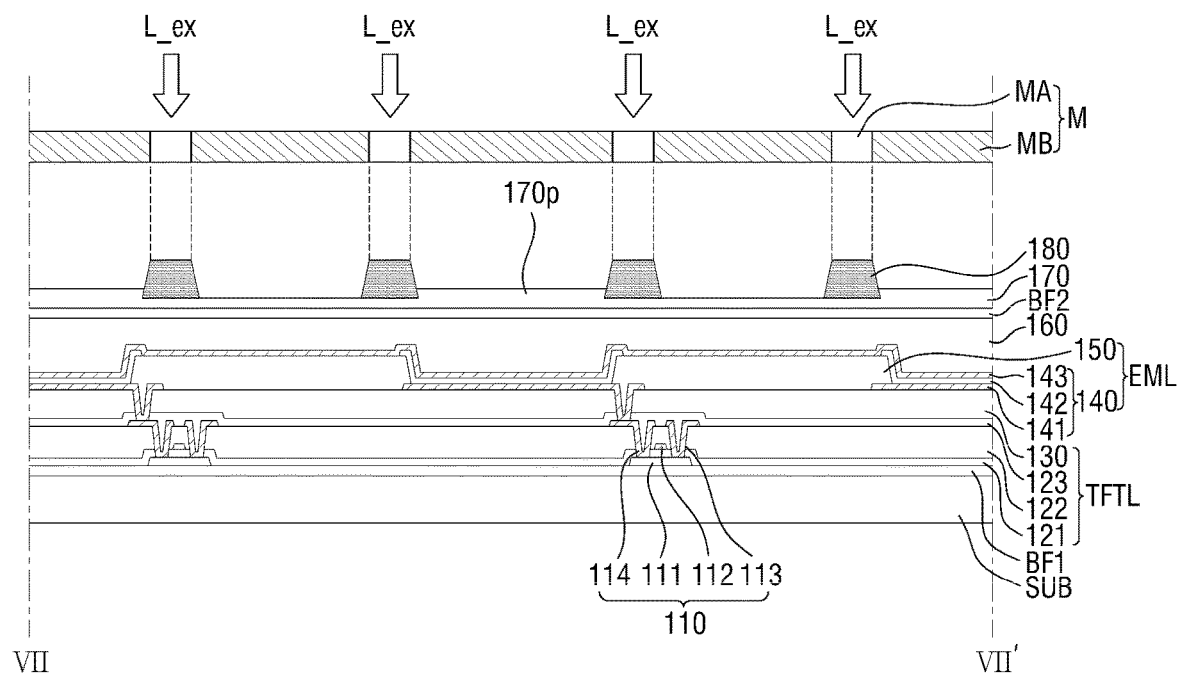
Figure 31:
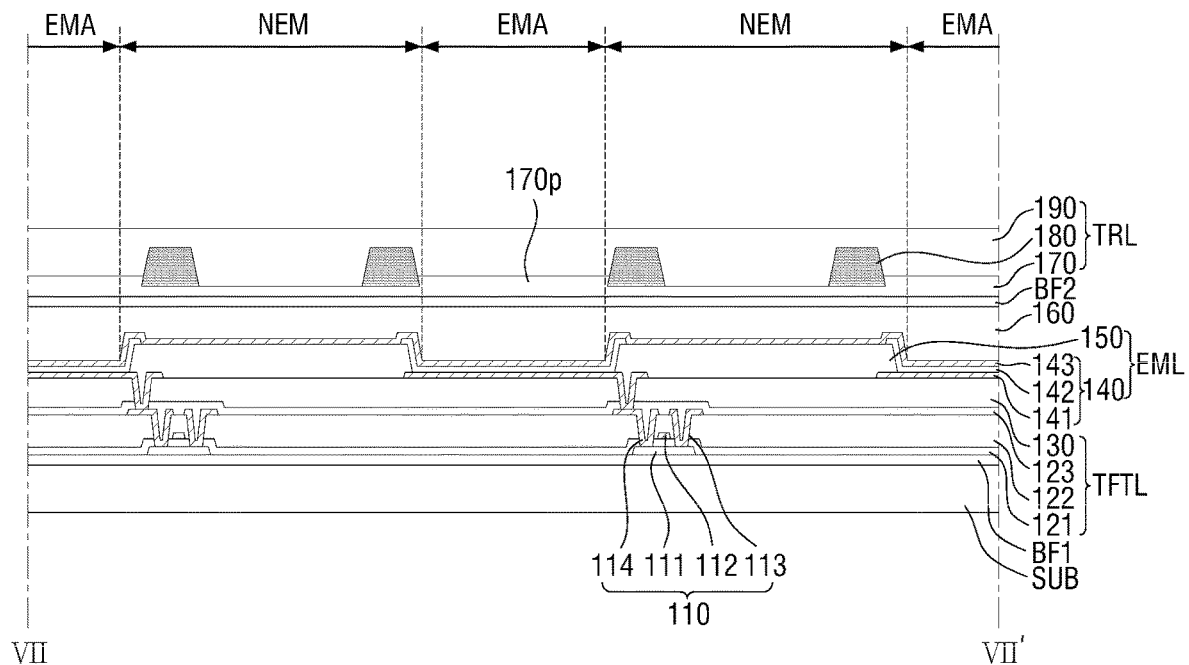
Figure 32:
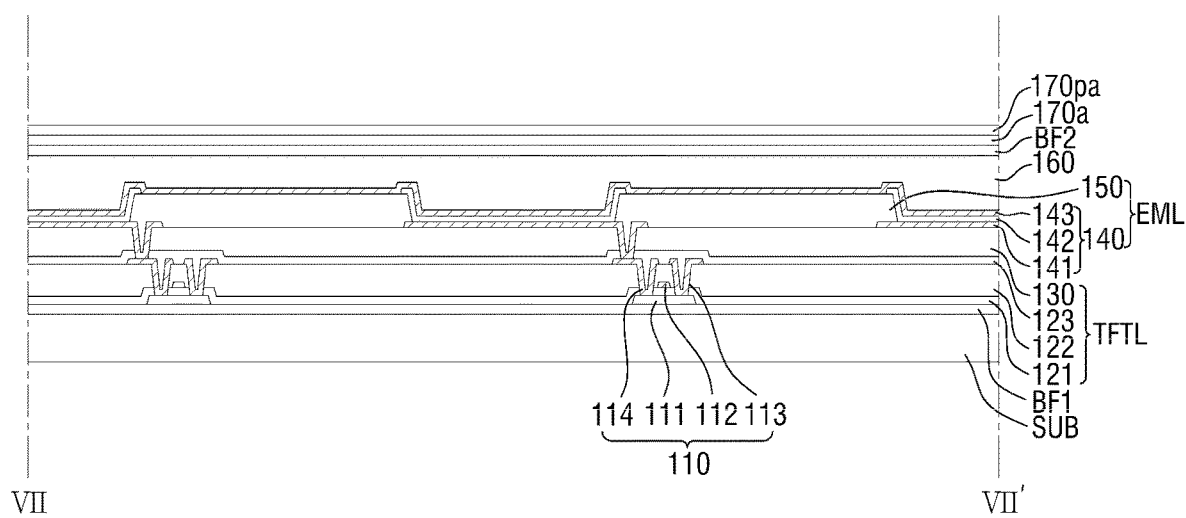
FIG. 32 is a cross-sectional view illustrating a method of manufacturing the display device according to another embodiment.

FIG. 23 is a flowchart illustrating a method of manufacturing the display device according to an embodiment. FIGS. 24 to 31 are cross-sectional views taken along the line VII-VII' of FIG. 5, and sequentially illustrates various processes of the method of manufacturing the display device according to an embodiment. FIG. 32 is a cross-sectional view illustrating a method of manufacturing the display device according to another embodiment.

FIGS. 24 to 31 relate to a method of manufacturing the display device shown in FIG. 7. Accordingly, the same reference symbols are given for the same or substantially the same elements, components, and layers as those of the embodiments described above, and thus, redundant description thereof may not be repeated. Hereinafter, the method of manufacturing the display device according to an embodiment will be described in more detail with reference to FIGS. 23 to 31.

Referring to FIGS. 23 to 31, the method of manufacturing the display device according to an embodiment may include forming a thin-film transistor, a light-emitting element, and a thin-film sealing layer on a substrate (S101), forming a base inorganic layer on the thin-film sealing layer (S103), forming a photoresist pattern on the base inorganic layer (S105), etching the base inorganic layer to form an inorganic layer (S107), removing the photoresist pattern (S109), forming a base organic layer on the inorganic layer (S111), etching the base organic layer to form a low refractive organic layer (S113), and forming a high refractive organic layer on the low refractive organic layer (S115).

First, a thin-film transistor layer TFTL, a light-emitting element layer EML, and a thin-film sealing layer 160 are formed on a substrate SUB.

In more detail, a first buffer film BF1 may be formed on the substrate SUB. The first buffer film BF1 may be formed to protect a thin-film transistor 110 and a light-emitting element 140 from moisture permeating through the substrate SUB, which may be vulnerable to moisture penetration, and may include a plurality of inorganic films that are alternately stacked on one another. For example, the first buffer film BF1 may be formed as a multilayered film in which one or more inorganic films from among a silicon oxide film ($SiO_x$), a silicon nitride film ($SiN_x$), and a silicon oxynitride film (SiON) are alternately stacked on one another. The first buffer film BF1 may be formed using a chemical vapor deposition (CVD) method.

Thereafter, an active layer 111 of the thin-film transistor 110 is formed on the first buffer film BF1. In more detail, an active metal layer is formed on the entire surface of the first buffer film BF1 using a sputtering method or a metal organic chemical vapor deposition (MOCVD) method. Thereafter, the active metal layer is patterned by a mask process using a photoresist pattern to form the active layer 111. The active layer 111 may be formed of a silicon-based semiconductor material or an oxide-based semiconductor material.

Thereafter, a gate insulating film 121 is formed on the active layer 111. The gate insulating film 121 may be formed as an inorganic film, for example, such as a silicon oxide film ($SiO_x$), a silicon nitride film ($SiN_x$), or a multilayered film thereof.

Thereafter, a gate electrode 112 of the thin-film transistor 110 is formed on the gate insulating film 121. In more detail, a first metal layer is formed on the entire surface of the gate insulating film 121 using a sputtering method, an MOCVD method, or the like. Afterward, the first metal layer is patterned by a mask process using a photoresist pattern to form the gate electrode 112. The gate electrode 112 may be formed as a single layer or multilayers including (e.g., made of) at least one selected from among molybdenum (Mo), aluminum (Al), chromium (Cr), gold (Au), titanium (Ti), nickel (Ni), neodymium (Nd), copper (Cu), and/or an alloy thereof.

Thereafter, an interlayer insulating film 122 is formed on the gate electrodes 112. The interlayer insulating film 122 may be formed as an inorganic film, for example, such as a silicon oxide film ($SiO_x$), a silicon nitride film ($SiN_x$), or a multilayered film thereof.

Thereafter, a contact hole is formed, which exposes the active layer 111 by passing through (e.g., by penetrating) the gate insulating film 121 and the interlayer insulating film 122.

Thereafter, source and drain electrodes 113 and 114 of the thin-film transistor 110 are formed on the interlayer insulating film 122. In more detail, a second metal layer is formed on the entire surface of the interlayer insulating film 122 using a sputtering method, an MOCVD method, or the like. Afterward, the second metal layer is patterned by a mask process using a photoresist pattern to form the source and drain electrodes 113 and 114. Each of the source and drain electrodes 113 and 114 may be connected to the active layer 111 through a contact hole passing through (e.g., penetrating) the gate insulating film 121 and the interlayer insulating film 122. Each of the source and drain electrodes 113 and 114 may be formed as a single layer or multilayers including (e.g., made of) at least one selected from among molybdenum (Mo), aluminum (Al), chromium (Cr), gold (Au), titanium (Ti), nickel (Ni), neodymium (Nd), copper (Cu), and/or an alloy thereof.

Thereafter, a protective film 123 is formed on the source and drain electrodes 113 and 114 of the thin-film transistor 110. The protective film 123 may be formed as an inorganic film, for example, such as a silicon oxide film ($SiO_x$), a silicon nitride film ($SiN_x$), or a multilayered film thereof. The protective film 123 may be formed using a CVD method.

Thereafter, a planarization film 130 is formed on the protective film 123 to planarize or substantially planarize a step difference due to the thin-film transistor 110. The planarization film 130 may be formed as an organic film including (e.g., made of) an acryl resin, an epoxy resin, a phenolic resin, a polyamide resin, a polyimide resin, or the like.

Thereafter, a first electrode 141 of the light-emitting element 140 is formed on the planarization film 130. In more detail, a third metal layer is formed on the entire surface of the planarization film 130 using a sputtering method, an MOCVD method, or the like.

Thereafter, the third metal layer is patterned by a mask process using a photoresist pattern to form the first electrode 141. The first electrode 141 may be connected to the drain electrode 114 of the thin-film transistors 110 through a contact hole passing through (e.g., penetrating) the protective film 123 and the planarization film 130. The first electrode 141 may include (e.g., may be made of) a conductive (metallic) material that has high reflectivity, for example, such as a stacked structure (Ti/Al/Ti) of aluminum and titanium, a stacked structure (ITO/Al/ITO) of aluminum and ITO, a silver-palladium-copper (APC) alloy, and/or a stacked structure (ITO/APC/ITO) of an APC alloy and ITO.

Thereafter, in order to partition the pixels, a bank layer 150 is formed to cover an edge of the first electrode 141 on the planarization film 130. The bank layer 150 may be formed as an organic film including (e.g., made of) an acryl resin, an epoxy resin, a phenolic resin, a polyamide resin, or a polyimide resin.

Thereafter, an organic light-emitting layer 142 is formed on the first electrode 141 and the bank layer 150 by a deposition process or a solution process. The organic light-emitting layer 142 may be a common layer commonly formed in the pixels. In some embodiments, the organic light-emitting layer 142 may be formed to have a tandem structure of two stacks or more. Each of the stacks may include a hole transporting layer, at least one light-emitting layer, and an electron transporting layer. In addition, a charge generation layer may be formed between the stacks. The charge generation layer may include an n-type charge generation layer located adjacent to a bottom stack, and a p-type charge generation layer formed on the n-type charge generation layer and located adjacent to a top stack. The n-type charge generation layer injects electrons into the bottom stack, and the p-type charge generation layer injects holes into the top stack. The n-type charge generation layer may be formed as an organic layer doped with an alkali metal, for example, such as Li, Na, K, or Cs, or an alkaline earth metal, for example, such as Mg, Sr, Ba, or Ra. The p-type charge generation layer may be formed by doping an organic material having hole transport capability with a dopant.

Thereafter, a second electrode 143 is formed on the organic light-emitting layer 142. The second electrode 143 may be a common layer formed commonly in the pixels P. The second electrode 143 may include (e.g., may be made of) a transparent conductive material (TCO), for example, such as ITO or IZO, which is light-transmissive, or a semi-transmissive conductive material, for example, such as magnesium (Mg), silver (Ag), or an alloy of magnesium (Mg) and silver (Ag). The second electrode 143 may be formed by a physical vapor deposition method, for example, such as a sputtering method. A capping layer may be formed on the second electrode 143.

Thereafter, a thin-film sealing layer 160 is formed on the second electrode 143. The thin-film sealing layer 160 serves to prevent or substantially prevent oxygen and/or moisture from permeating into the organic light-emitting layer 142 and the second electrode 143. For example, the thin-film sealing layer 160 may include at least one inorganic film and at least one organic film.

For example, the thin-film sealing layer 160 may include a first sealing inorganic film, a sealing organic film, and a second sealing inorganic film. In this case, the first sealing inorganic film is formed to cover the second electrode 143. The sealing organic film is formed to cover the first sealing inorganic film. The sealing organic film may be formed to have a sufficient thickness, so as to prevent or substantially prevent particles from penetrating the first sealing inorganic film and entering the organic light-emitting layer 142 and the second electrode 143. The second sealing inorganic film is formed to cover the sealing organic film. Each of the first and second sealing inorganic films may include (e.g., may be made of) silicon nitride, aluminum nitride, zirconium nitride, titanium nitride, hafnium nitride, tantalum nitride, silicon oxide, aluminum oxide, or titanium oxide. The sealing organic film may include (e.g., may be made of) an acryl resin, an epoxy resin, a phenolic resin, a polyamide resin, a polyimide resin, or the like.

Next, a base inorganic layer 170a is formed on the thin-film sealing layer 160.

A second buffer film BF2 may be further formed on the thin-film sealing layer 160 before the base inorganic layer 170a is formed. The second buffer film BF2 may be formed as a single layer film including an inorganic material.

For example, the base inorganic layer 170a may be formed as a single layer film including one material from among silicon nitride, silicon oxynitride, silicon oxide, titanium oxide, and/or aluminum oxide, and may be formed entirely on the thin-film sealing layer 160 by a deposition process. A thickness h1 of the base inorganic layer 170a may be, for example, 5000 Å, but is not limited thereto, and may be greater or smaller than 5000 Å.

Then, a photoresist pattern PR is formed on the base inorganic layer 170a. The photoresist pattern PR may be formed to overlap with a position at (e.g., in or on) which a protruding pattern part 170p, which will be described in more detail below, is formed. The photoresist pattern PR may be formed to overlap or substantially overlap with the organic light-emitting layer 142 of the light-emitting element 140.

Next, the base inorganic layer 170a is etched to form an inorganic layer 170 and the protruding pattern part 170p.

The base inorganic layer 170a between the photoresist patterns PR, excluding a portion covered by the photoresist pattern PR, may be etched. An area covered by the photoresist pattern PR may not be etched, so that the protruding pattern part 170p may be formed. Depending on the etching process, a lateral surface part of the protruding pattern part 170p may also be partially etched, and thus, the lateral surface of the protruding pattern part 170p may have a reverse tapered shape.

A thickness h2 of an area, at (e.g., in or on) which the protruding pattern part 170p of the inorganic layer 170 is not formed, may be less than the thickness h1 of the base inorganic layer 170a, but a thickness of an area, at (e.g., in or on) which the protruding pattern part 170p of the inorganic layer 170 is formed, may be equal to or substantially equal to (or similar to) the thickness h1 of the base inorganic layer 170a.

Thereafter, the photoresist pattern PR is removed.

Then, a base organic layer 180aa is formed on the inorganic layer 170.

The base organic layer 180aa may be formed entirely on the inorganic layer 170 to cover the inorganic layer 170. The base organic layer 180aa may be formed by a deposition process or a solution process.

The base organic layer 180aa may include an organic material. For example, the base organic layer 180aa may be formed as a single layer film including an organic material, for example, such as an acrylic resin, an epoxy resin, a phenolic resin, a polyamide resin, or a polyimide resin, but the present disclosure is not limited thereto. In addition, the base organic layer 180aa may include a photosensitive material having properties that change when exposed to light. For example, the base organic layer 180aa may be a negative photoresist, and thus, when exposed to light, the exposed area may be cured and not dissolved by a developer.

Next, the base organic layer 180aa is etched to form a low refractive organic layer 180.

As described above, in the case in which the base organic layer 180aa is a negative photoresist, a mask M may be disposed on the base organic layer 180aa, and light L_ex may be irradiated thereon to form the low refractive organic layer 180. The mask M may include a transmissive area MA and a non-transmissive area MB such that only an area for forming the low refractive organic layer 180 selectively transmits the light L_ex.

The low refractive organic layer 180 may be formed by selectively exposing the base organic layer 180aa to the light L_ex, and then removing a portion of the base organic layer 180aa that is not exposed to the light L_ex using a developer.

In the present operation, as described above with reference to FIGS. 9 to 11, a total reflection surface of the low refractive organic layer 180 may be formed as a double tapered surface, or may have a structure in which the tapered surfaces are not aligned with each other, according to a process margin.

Then, a high refractive organic layer 190 is formed on the low refractive organic layer 180.

The high refractive organic layer 190 may be formed to cover the inorganic layer 170 and the low refractive organic layer 180, so that a total reflection layer TRL disposed on the thin-film sealing layer 160 may be planarize or substantially planarized (e.g., may be generally planarized). The high refractive organic layer 190 may be formed by a deposition process or a solution process.

The high refractive organic layer 190 may include an organic material. For example, the high refractive organic layer 190 may be formed as a single layer film including an organic material, for example, such as an acrylic resin, an epoxy resin, a phenolic resin, a polyamide resin, or a polyimide resin, but the present disclosure is not limited thereto as long as the organic material is an organic material having a refractive index higher than that of the low refractive organic layer 180. The high refractive organic layer 190 may include a material having a higher refractive index than that of the low refractive organic layer 180, and may be formed to be thicker than the low refractive organic layer 180.

Because the process of forming the total reflection layer TRL shown in FIGS. 24 to 31 is a formation process that is performed on the thin-film sealing layer 160 covering the light-emitting element 140, in order to prevent or substantially prevent the light-emitting element 140 from being damaged, the formation process may be a low-temperature process of 100° C. or less.

FIG. 32 illustrates a method of manufacturing the display device when the protruding pattern part 170p_1, 170p_3, 170p_5, or 170p_7 is formed separately from the inorganic layer 170, as shown in the embodiments of FIGS. 12, 16, 19, and 22. As an example, for convenience, FIG. 32 will be described in more detail with reference to FIG. 12.

Referring to FIG. 32, the method of manufacturing the display device in which the protruding pattern part 170p_1 is formed as a separate layer from that of an inorganic layer 170_1 further includes forming a base supporting layer 170pa on a base inorganic layer 170a.

The base supporting layer 170pa is a layer formed to form the protruding pattern part 170p_1 (or 170p_3, 170p_5, or 170p_7), and may include an inorganic material. For example, the base supporting layer 170pa may be formed as a single layer film including one material from among silicon nitride, silicon oxynitride, silicon oxide, titanium oxide, and/or aluminum oxide. The base supporting layer 170pa may be formed by a deposition process, but the present disclosure is not limited thereto.

The base supporting layer 170pa may include (e.g., may be made of) a material that is different from that of the base inorganic layer 170a. In addition, a thickness of the base supporting layer 170pa may be less than that of the base inorganic layer 170a. However, the present disclosure is not limited thereto, and the base supporting layer 170pa may include (e.g., may be made of) the same material as that of the base inorganic layer 170a, or may be formed to be thicker than the base inorganic layer 170a.

The manufacturing method of FIG. 32 is the same or substantially the same as (or similar to) the above-described manufacturing method described with reference to FIGS. 24-31, except that the base inorganic layer 170a is formed as the inorganic layer 170_1 (e.g., see FIG. 12), and the base supporting layer 170pa is formed as the protruding pattern part 170p_1 (e.g., see FIG. 12), and thus, redundant description thereof may not be repeated.

While some embodiments of the present disclosure have been described with reference to the accompanying drawings, it should be understood by those skilled in the art that various modifications may be made without departing from the spirit and scope of the present disclosure, and without changing essential features thereof. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

The invention claimed is:

1. A display device comprising:
a substrate comprising a plurality of pixels;
a bank layer on the substrate along a boundary of each of the pixels, and configured to define a light-emitting area;
an organic light-emitting layer in the light-emitting area defined by the bank layer;
a thin-film sealing layer covering the organic light-emitting layer and the bank layer;
an inorganic layer comprising a base part on the thin-film sealing layer, and a protruding pattern part protruding from the base part in a thickness direction, the protruding pattern part comprising an upper surface, and a lateral surface overlapping with the upper surface of the protruding pattern part in the thickness direction;
a first-first refractive organic layer on the base part of the inorganic layer; and
a second refractive organic layer covering the first-first refractive organic layer and the inorganic layer, the second refractive organic layer having a refractive index higher than that of the first-first refractive organic layer,
wherein a lateral surface of the first-first refractive organic layer contacts the lateral surface of the protruding pattern part, and an upper surface of the first-first refractive organic layer protrudes in the thickness direction more than the upper surface of the protruding pattern part in the thickness direction.

2. The display device of claim 1, wherein:
the display device comprises a first area, and a second area, the bank layer being at the first area, and the light-emitting area being at the second area;
the base part of the inorganic layer is at the first area and the second area;
the protruding pattern part of the inorganic layer is at the second area;
the first-first refractive organic layer is at the first area; and
the second refractive organic layer is at the first area and the second area.

3. The display device of claim 2, wherein:
a refractive index of the inorganic layer is higher than the refractive index of the second refractive organic layer.

4. The display device of claim 3, wherein the protruding pattern part and the base part comprise the same material as each other, and are coupled to each other without a physical boundary therebetween.

5. The display device of claim 4, wherein the first-first refractive organic layer comprises at least one of silicon nitride, silicon oxynitride, silicon oxide, titanium oxide, or aluminum oxide.

6. The display device of claim 3, wherein the protruding pattern part and the base part comprise different materials from each other, and are located at separate layers from each other.

7. The display device of claim 2, wherein the first-first refractive organic layer comprises a lower refractive organic layer that contacts the lateral surface of the protruding pattern part, and an upper refractive organic layer that protrudes more than the upper surface of the protruding pattern part in the thickness direction.

8. The display device of claim 7, wherein:
the lower refractive organic layer comprises a first tapered surface adjacent to a pixel from among the plurality of pixels;
the upper refractive organic layer comprises a second tapered surface adjacent to the pixel;
an inclination angle of the first tapered surface has as a first taper angle;
an inclination angle of the second tapered surface has as a second taper angle;
the first taper angle is in a range of 60° to 85° with respect to a bottom surface of the lower refractive organic layer; and
the second taper angle is in a range of 60° to 85° with respect to a plane defined by an upper surface of the protruding pattern part.

9. The display device of claim 8, wherein the second taper angle is equal to the first taper angle.

10. The display device of claim 8, wherein the second taper angle is different from the first taper angle.

11. The display device of claim 10, wherein the first tapered surface and the second tapered surface are at different planes from each other.

12. The display device of claim 8, wherein the first taper angle is in a range of 70° to 75° with respect to the bottom surface of the lower refractive organic layer.

13. The display device of claim 7, wherein the lower refractive organic layer has a thickness that is less than that of the upper refractive organic layer.

14. The display device of claim 2, further comprising a buffer film between the thin-film sealing layer and the inorganic layer,
wherein the buffer film comprises the same material as that of the inorganic layer.

15. The display device of claim 14, further comprising a touch sensor layer on the thin-film sealing layer,
wherein the touch sensor layer is at the first area.

16. The display device of claim 15, wherein the touch sensor layer does not overlap with the first-first refractive organic layer.

17. The display device of claim 16, wherein the touch sensor layer comprises a first metal layer on the buffer film, and a second metal layer on the inorganic layer.

18. The display device of claim 2, further comprising a second-first refractive organic layer at the first area, and surrounding the first-first refractive organic layer in a plan view, the second-first refractive organic layer having a refractive index lower than that of the second refractive organic layer.

19. The display device of claim 18, wherein the inorganic layer further comprises a second protruding pattern part between the first-first refractive organic layer and the second-first refractive organic layer.

20. A method of manufacturing a display device comprising a light-emitting element, and a thin-film sealing layer on the light-emitting element, the method comprising:

forming a base inorganic layer on the thin-film sealing layer;

etching the base inorganic layer, and forming an inorganic layer comprising a base part and a protruding pattern part;

forming a base organic layer on the inorganic layer;

etching the base organic layer, and forming a first refractive organic layer on the base part; and forming a second refractive organic layer covering the first refractive organic layer, and having a refractive index that is higher than that of the first refractive organic layer, wherein the protruding pattern part comprises a lateral surface protruding from the base part in a thickness direction and an upper surface, wherein the lateral surface of the protruding pattern part overlaps with the upper surface of the protruding pattern part in the thickness direction, and wherein the first refractive organic layer comprises a lateral surface contacting the lateral surface of the protruding pattern part, and an upper surface protruding more than the upper surface of the protruding pattern part in the thickness direction.

\* \* \* \* \*